(12) United States Patent
Bringivijayaraghavan et al.

(10) Patent No.: US 10,522,217 B1
(45) Date of Patent: Dec. 31, 2019

(54) COLUMN-DEPENDENT POSITIVE VOLTAGE BOOST FOR MEMORY CELL SUPPLY VOLTAGE

(71) Applicant: GLOBALFOUNDRIES INC., Grand Cayman (KY)

(72) Inventors: Venkatraghavan Bringivijayaraghavan, Cheyyar (IN); Eswararao Potladhurthi, Bengaluru (IN); George M. Braceras, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/057,857

(22) Filed: Aug. 8, 2018

(51) Int. Cl.
  *G11C 11/00* (2006.01)
  *G11C 11/419* (2006.01)
  *G11C 11/412* (2006.01)

(52) U.S. Cl.
  CPC .......... *G11C 11/419* (2013.01); *G11C 11/412* (2013.01)

(58) Field of Classification Search
  CPC ............................ G11C 11/419; G11C 11/412
  USPC ........................................................ 365/156
  See application file for complete search history.

(56) References Cited

U.S. PATENT DOCUMENTS

| 6,178,136 | B1 | 1/2001 | Lin et al. |
| 8,861,290 | B2 | 10/2014 | Zimmer et al. |
| 9,627,040 | B1* | 4/2017 | Chang ................... G11C 11/419 |
| 2010/0072816 | A1 | 3/2010 | Kenkare et al. |
| 2011/0280094 | A1 | 11/2011 | Heymann et al. |
| 2013/0286717 | A1 | 10/2013 | Adams et al. |
| 2014/0160871 | A1 | 6/2014 | Zimmer et al. |
| 2014/0204657 | A1 | 7/2014 | Dally |
| 2015/0131364 | A1 | 5/2015 | Hsieh et al. |
| 2016/0247557 | A1 | 8/2016 | Jeong et al. |
| 2016/0247559 | A1* | 8/2016 | Atallah ................. G11C 11/419 |
| 2019/0108872 | A1* | 4/2019 | Gupta ...................... G11C 7/12 |

* cited by examiner

*Primary Examiner* — Vu A Le

(74) *Attorney, Agent, or Firm* — Gibb & Riley, LLC; Michael J. LeStrange, Esq.

(57) ABSTRACT

Disclosed is a chip with a memory array and at least one positive voltage boost circuit, which provides positive voltage boost pulses to the sources of pull-up transistors in the memory cells of the array during write operations to store data values in those memory cells and, more specifically, provides positive voltage boost pulses substantially concurrently with wordline deactivation during the write operations to ensure that the data is stored. Application of such pulses to different columns can be performed using different positive voltage boost circuits to minimize power consumption. Also disclosed are a memory array operating method that employs a positive voltage boost circuit and a chip manufacturing method, wherein post-manufacture testing is performed to identify chips having memory arrays that would benefit from positive voltage boost pulses and positive voltage boost circuits are attached to those identified chips and operably connected to the memory arrays.

20 Claims, 14 Drawing Sheets

COLUMN-DEPENDENT POSITIVE VOLTAGE BOOST FOR MEMORY CELL SUPPLY VOLTAGE

BACKGROUND

Field of the Invention

The present invention relates to memory arrays (e.g., static random access memory (SRAM) arrays) and, more particularly, to integrated circuit (IC) structures with memory arrays and methods of manufacturing and operating such IC structures to enhance low voltage writeability.

Description of Related Art

Those skilled in the art will recognize that the combination of memory cell size scaling, positive cell supply voltage (PVCS) lowering, and process variations can cause memory cell writeability issues.

For example, FIG. 1 is a schematic drawing illustrating a conventional six-transistor (6T) static random access memory (SRAM) cell 100, which includes a pair of complementary storage nodes (i.e., storage node true 105 and storage node complement 115) and which is connected to a wordline (WL) 140 and to a pair of complementary bitlines (i.e., bitline true 131 and bitline complement 132) within an SRAM memory array (not shown). Specifically, this SRAM cell 100 includes first and second inverters that are cross-coupled. The first inverter is connected between a positive voltage rail 121 and a ground rail 122 and includes a first pull-up transistor 101 (e.g., a P-type field effect transistor (PFET)) connected in series to a first pull-down transistor 102 (e.g., an N-type field effect transistor (NFET)). A storage node true 105 between the first pull-up and pull-down transistors 101-102 is connected to the drain of a first pass-gate transistor 103 (e.g., an NFET). The source of the first pass-gate transistor 103 is connected to a bitline true 131. The second inverter is also connected between the positive voltage rail 121 and the ground rail 122 and includes a second pull-up transistor 111 (e.g., a PFET) connected in series to a second pull-down transistor 112 (e.g., an NFET). A storage node complement 115 between the second pull-up and pull-down transistors 111-112 is connected to the drain of a second pass-gate transistor (e.g., an NFET). The source of the second pass-gate transistor 113 is connected to a bitline complement 132. The gates of the first and second pass-gate transistors 103 and 113 are connected to a wordline (WL) 140.

During a read operation, a data value stored in a selected memory cell is read. To accomplish this, the bitline true 131 and the bitline complement 132 are both pre-charged to a positive cell supply voltage (PVCS) level and the wordline 140 is activated (i.e., charged to the PVCS level), turning on the first and second pass-gate transistors 103 and 113. When a data value of "1" is stored at storage node true 105, the bitline true 131 will remain charged at the PVCS level and the bitline complement 132 will be discharged to ground 122. When a data value of "0" is stored at the storage node true 105, the bitline true 131 will be discharged to ground and the bitline complement 132 will remain charged to the PVCS level. A sense amplifier at the end of a column, which contains the selected memory cell, will sense whether the bitline true 131 or the bitline complement 132 has a higher voltage level and, thereby will sense the data value stored in the memory cell (i.e., a "1" if the bitline true 131 has the higher voltage level and a "0" if the bitline complement 132 has the higher voltage level).

During a write operation, a data value of a "1" or a "0" is written to the storage node true 105 of a selected memory cell. To store a data value of "1", the bitline true 131 remains charged at the PVCS level and the bitline complement 132 is discharged to ground 122. When the wordline 140 is activated to turn on the first and second pass-gate transistors 103 and 113, the data value "1" will be stored on the storage node true 105. Contrarily, to store a data value of "0" on the storage node true 105, the bitline true 131 is discharged to ground 122 and the bitline complement 132 remains charged to the PVCS level. When the wordline 140 is activated, the data value "0" will be stored on the storage node true 105.

In such a memory cell the combination of size scaling (e.g., using single semiconductor fin pull-up transistors), PVCS lowering and process variations (e.g., threshold voltage variations at the process corners) can result in some pull-up transistors 101, 111 across the memory array having insufficient headroom to ensure that a data value is stored properly on the storage node during the write operation. Specifically, as mentioned above, when writing a "1" data value to the storage node true 105, the bitline true 131 remains charged to the PVCS level and the bitline complement 132 is discharged to ground 122. When the wordline is activated, the voltage level on the storage node true 105 increases. To ensure that the data value of "1" is stored on the storage node true 105, the voltage on this storage node true 105 needs to rise to the PVCS level and remain there. However, if the second pull-up transistor 111 is not turned off fast enough and the first pull-up transistor 101 is not turned on fast enough, because of insufficient headroom at lower voltages, then the voltage on the storage node true 105 may not rise to the PVCS level such that the write is not completed. An incomplete write will make the cell unstable in subsequent read operations.

SUMMARY

In view of the foregoing, disclosed herein are embodiments of an integrated circuit chip that includes a memory array (e.g., a static random access memory (SRAM) array) and at least one positive voltage boost circuit (PVBC), which is used to improve writeability within memory cells when, for example, the memory array operates using a relatively low positive cell supply voltage and the chip is manufactured at the fast n-type field effect transistor (NFET)-slow p-type field effect transistor (PFET) process corner. The PVBC can be operably connected to the memory array and can provide positive voltage boost pulses to the sources of pull-up transistors in the memory cells during write operations to store data values in those memory cells and, more specifically, can provide such positive voltage boost pulses substantially concurrently with wordline deactivation during the write operations to ensure that the write operations are completed and the stored data value is stable particularly when operating at the fast NFET-slow PFET process corner. Optionally, positive voltage boost pulses can be applied to the memory cells in a selected column only (i.e., not to the cells in other columns) so as to minimize power consumption. Also disclosed herein are embodiments of a memory array operating method, wherein such positive voltage boost pulses are applied during write operations. Finally, also disclosed herein are embodiments of a manufacturing method, wherein post-manufacture testing is performed to identify IC chips having memory arrays that would benefit from such positive voltage boost pulses (e.g., IC chips which will operate at a relatively low positive cell supply voltage) and wherein PVBCs are attached to the substrates of those identified chips and operably connected to the memory arrays.

More particularly, disclosed herein are embodiments of an integrated circuit (IC) chip. The IC chip can include a substrate and a memory array on the substrate. The memory array can be, for example, a static random access memory (SRAM) array with columns and rows of SRAM cells. The IC chip can further include at least one positive voltage boost circuit (PVBC), which is on the substrate and which is operably connected to the memory array so as to provide positive voltage boost pulses to memory cells in the memory array substantially concurrently with wordline deactivation during write operations performed in order to store data values in the memory cells. It should be noted that, as discussed in greater detail below in the detailed description section, in order to minimize power consumption the IC chip can optionally include different PVBCs to apply positive voltage boost pulses to different columns in the memory array (as opposed to including only a single PVBC to apply positive voltage boost pulses to all columns in the memory array).

Also disclosed herein are embodiments of a memory array operating method. Specifically, the method can include providing an IC chip, such as the IC chip described above, that includes a substrate and, on the substrate, a memory array and at least one positive voltage boost circuit (PVBC) that is operably connected to the memory array so as to provide positive voltage boost pulses to memory cells in the memory array substantially concurrently with wordline deactivation during write operations performed in order to store data values in the memory cells. The method can further include performing a write operation to write a data value to a specific memory cell in a specific column and a specific row of a memory array. Performing the write operation can include maintaining the bitline true of the specific column at a first positive voltage level; discharging the bitline complement of the specific column to ground (while the bitline true remains charged to the first positive voltage level); charging the wordline to the first positive voltage level such that writing of the data value is initiated; and subsequently and, particularly, after some predetermined period of time, substantially concurrently discharging the wordline to ground and applying a positive voltage boost pulse to a positive voltage rail electrically connected to sources of pull-up transistors in the specific memory cell. Application of the positive voltage boost pulse is performed using a PVBC and increases the voltage on the positive voltage rail from the first positive voltage level to a higher second positive voltage level. By doing so, this method ensures that the writing of the data value is completed even in the case of an IC chip operating at the fast n-type field effect transistor (NFET)-slow p-type field effect transistor (PFET) process corner and at a relatively low operating voltage. It should be noted that, optionally as discussed further in the detailed description section below, application of the positive voltage boost pulses to different columns in the array could be applied using different PVBCs in order to minimize power consumption.

Finally, also disclosed herein are embodiments of a method of manufacturing integrated circuit (IC) chips, wherein post-manufacture testing is performed to identify IC chips having memory arrays that would benefit from such positive voltage boost pulses (e.g., fast n-type field effect transistor (NFET)-slow p-type field effect transistor (PFET) process corner IC chips that will be operated at a relatively low voltage level) and wherein positive voltage boost circuits (PVBCs) are attached to the substrates of those identified chips and operably connected to the memory arrays thereon. Specifically, this method can include manufacturing IC chips. Each IC chip can include a substrate and a memory circuit, which includes a memory array and peripheral circuitry. This method can further include testing the IC chips to determine the switching speeds of the N-type field effect transistors (NFETs) and the P-type field effect transistors (PFETs) on the IC chips and, particularly, in the memory cells of the memory array. The IC chips can then be sorted into groups, based on results of the testing. For example, the groups can include different process corner groups and, particularly, one or more groups containing IC chips that operate at one or more of the different process corners. The groups can include at least a fast NFET-slow PFET process corner group, which contains IC chips that have fast NFETs (e.g., $3\sigma$ fast NFETs or higher) and slow PFETs (e.g., $3\sigma$ slow PFETs or higher). This method can further include attaching positive voltage boost circuit(s) (PVBC(s)) to one or more selected IC chips from the fast NFET-slow PFET process corner group and, on each selected IC chip, operably connecting the PVBC(s) to the memory array so as to enable the application of positive voltage boost pulses to memory cells in the memory array substantially concurrently with wordline deactivation during write operations to store data values in the memory cells. It should be noted that, optionally as discussed further in the detailed description section below, multiple different PVBCs could be attached to the substrate and operably connected to the memory array so that positive voltage boost pulses to different columns in the array can be applied using different PVBCs in order to minimize power consumption.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
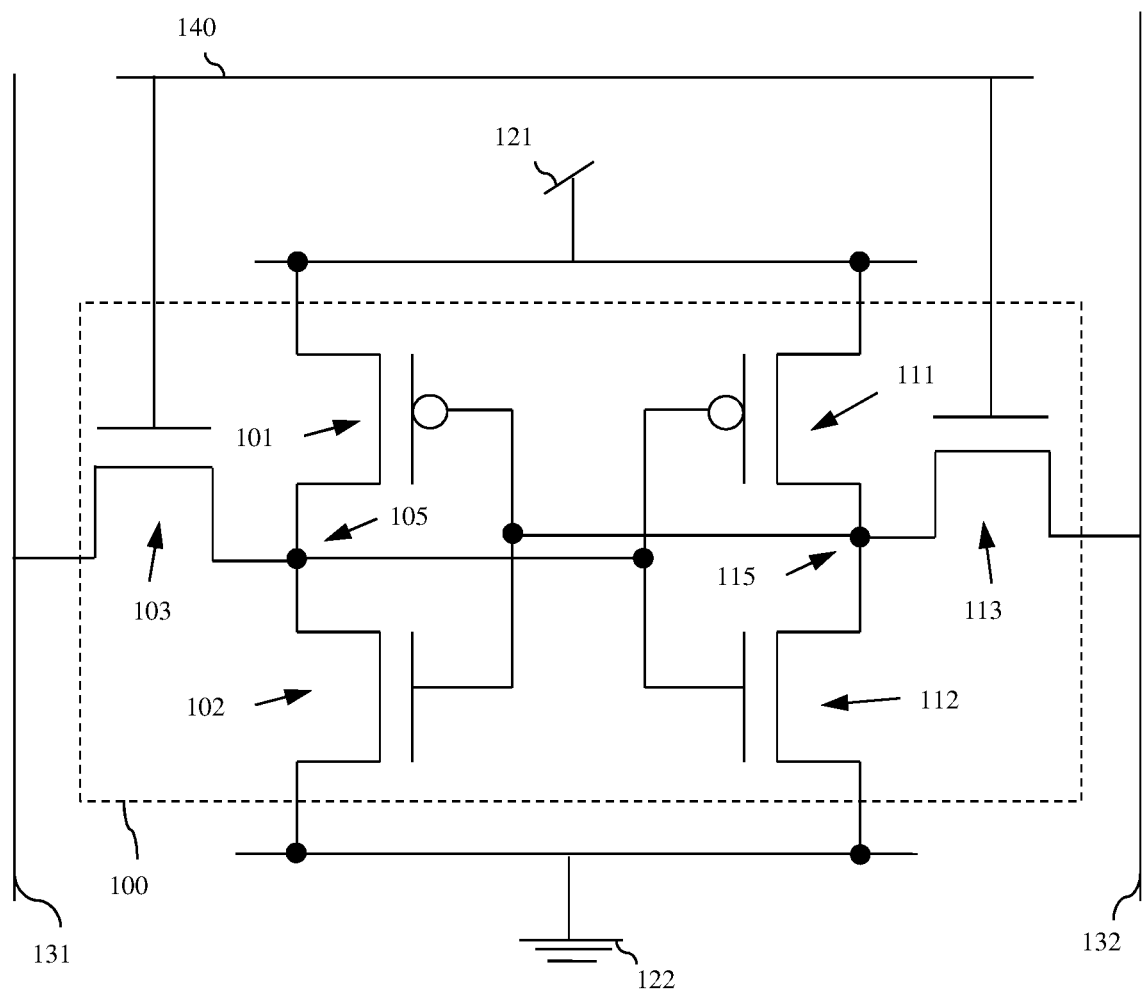
FIG. 1 is a schematic diagram illustrating a static random access memory (SRAM) cell.

As mentioned above, for a static random access memory (SRAM) cell 100, such as that shown in FIG. 1, the combination of size scaling (e.g., using single semiconductor fin pull-up transistors), positive cell supply voltage (PVCS) lowering and process variations (e.g., threshold voltage variations at the process corners) can result in some pull-up transistors 101, 111 across the memory array with insufficient headroom to ensure that a data value is stored properly on the storage node during the write operation. Specifically, when writing a "1" data value to the storage node true 105, the bitline true 131 remains charged to the PVCS level and the bitline complement 132 is discharged to ground 122. When the wordline is activated, the voltage level on the storage node true 105 increases. To ensure that the data value of "1" is stored on the storage node true 105, the voltage on this storage node true 105 needs to rise to the PVCS level and remain there. However, if the second pull-up transistor 111 is not turned off fast enough and the first pull-up transistor 101 is not turned on fast enough, because of insufficient headroom at lower voltages, then the voltage on the storage node true 105 may not rise to the PVCS level such that the write is not completed. An incomplete write will make the cell unstable in subsequent read operations.

Figure 2A:
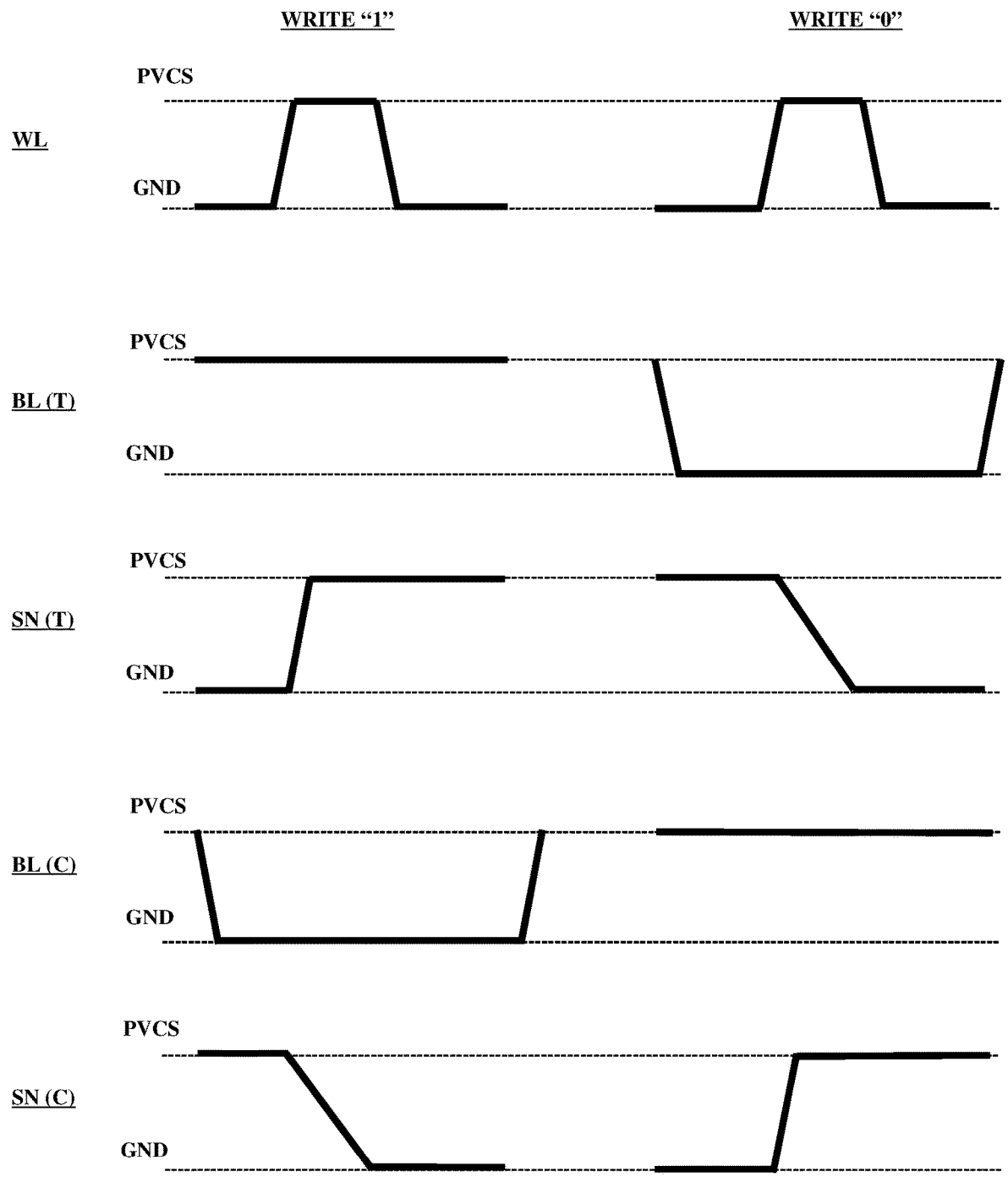
FIG. 2A is a timing diagram illustrating typical NFET-typical PFET process corner operation of an SRAM operating at a nominal cell supply voltage in a conventional SRAM array.
Figure 2B:
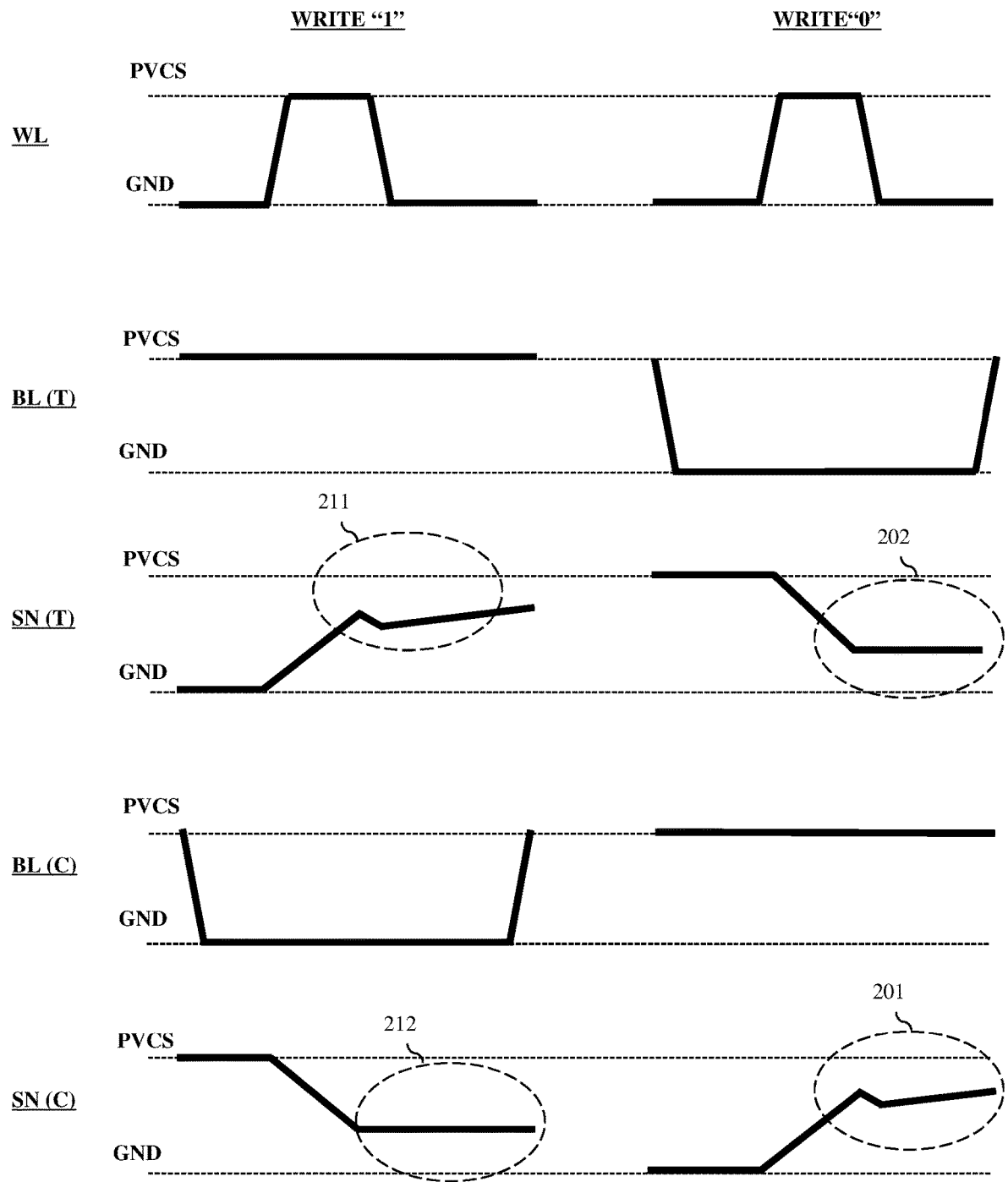
FIG. 2B is a timing diagram illustrating fast NFET-slow PFET process corner operation of an SRAM cell of FIG. 1 operating at a relatively low cell supply voltage in a conventional SRAM array.

For example, consider the case where the PVCS level is relatively low (e.g., less than 0.75V, such as at approximately 0.55V) and where a "1" data value is to be written to the storage node true 105. As illustrated in the timing diagram shown in FIG. 2A, at the typical n-type field effect transistor (NFET)-typical p-type field effect transistor (PFET) process corner, the first and second pull-up transistors 101 and 111 may have a threshold voltage (Vt) of 0.365V. In this case, the wordline (WL) 140 is activated (i.e., charged to the PVCS level) and the first and second pass-gate transistors 103 and 113 are turned on in order to connect the storage node true (SN(T)) 105 to the bitline true (BL(T)) 131, which is pre-charged to the PVCS level, and the storage node complement (SN(C)) 115 to the bitline complement (BL(C)) 132, which is discharged to ground. As a result, the voltage on the storage node true 105 begins to increase, turning off the second pull-up transistor 111. Additionally, the voltage on the storage node complement 115 is pulled down by the second pull-down and pass-gate transistors 112 and 113. A low voltage on the storage node complement 115 causes the first pull-up transistor 101 to turn on, thereby ensuring that the voltage on the storage node true 105 will be pulled up through the first pull-up transistor 101 to the PVCS level on the positive voltage rail 121 and completing storage of the data value "1" on that storage node true 105 (i.e., completing the write operation). However, at the fast NFET-slow PFET process corner, by applying, for example, a 6σ mismatch on the threshold voltage (Vt) of the pull-up transistors 101 and 111, it will have a higher effective Vt of 0.515V. In this case, as illustrated in the timing diagram of FIG. 2B, the first pull-up transistor 101 will struggle to turn on in response to a low voltage at the storage node complement 115. Thus, the voltage on the storage node true 105 will be pulled up with a high slew (i.e., slowly) and may not reach the PVCS level before the write operation times out (i.e., before the wordline is deactivated) (see items 211-212). Thus, the write may be incomplete.

Also, consider the case where the PVCS level is relatively low (e.g., less than 0.75V, such as at approximately 0.55V) and where and a "0" data value is to be written to the storage node true 105. Again, at the typical NFET-typical PFET process corner, the first and second pull-up transistors 101 and 111 may have a Vt of 0.365V. In this case, the wordline (WL) is activated (i.e., charged to PVCS) and the first and second pass-gate transistors 103 and 113 are turned on in order to connect the storage node true (SN(T)) 105 to the bitline true (BL(T)) 131, which is discharged to ground, and the storage node complement (SN(C)) 115 to the bitline complement (BL(C)) 132, which is charged to the PVCS level. As a result, the voltage on the storage node true 105 begins to decrease, turning on the second pull-up transistor 111 and, thereby pulling up the voltage on the storage node complement 115 to the PVCS level on the positive voltage rail 121. A high voltage on the storage node complement 115 will turn off the first pull-up transistor 101 ensuring that the storage node true 105 is pulled down to and remains at ground (i.e., stores a data value of "0").

However, at the fast NFET-slow PFET process corner, by applying, for example, a 6σ mismatch on the threshold voltage (Vt) of the pull-up transistors 101 and 111 will have a higher effective Vt of 0.515V. In this case, as illustrated in the SRAM cell timing diagram of FIG. 2B, the second pull-up transistor 111 will struggle to turn on such that the voltage on the storage node complement (SN(C)) 115 may not rises to the PVCS level fast enough to turn the first pull-up transistor 101 completely off. Thus, the voltage on the storage node true 105 may not reach ground before the write operation times out (i.e., before the wordline is deactivated) and the write may be incomplete (see items 201-202).

In any case, the higher effective threshold voltage, slows the pull-up transistors in a static random access memory (SRAM) cell resulting in an incomplete write of a "1" or a "0". This will make the cell unstable in subsequent read operations and, thus, can result in read errors. In view of the foregoing, disclosed herein are embodiments of an integrated circuit chip that includes a memory array (e.g., a static random access memory (SRAM) array) and at least one positive voltage boost circuit (PVBC), which is used to improve writeability within memory cells when, for example, the memory array operates using a relatively low positive cell supply voltage and the chip is manufactured at the fast n-type field effect transistor (NFET)-slow p-type field effect transistor (PFET) process corner. The PVBC can be operably connected to the memory array and can provide positive voltage boost pulses to the sources of pull-up transistors in the memory cells during write operations to store data values in those memory cells and, more specifically, can provide such positive voltage boost pulses substantially concurrently with wordline deactivation during the write operations to ensure that the write operations are completed and the stored data value is stable. Optionally, positive voltage boost pulses can be applied to the memory cells in a selected column only (i.e., not to the cells in other columns) so as to minimize power consumption. Also disclosed herein are embodiments of a memory array operating method, wherein such positive voltage boost pulses are applied during write operations. Finally, also disclosed herein are embodiments of a manufacturing method, wherein post-manufacture testing is performed to identify IC chips having memory arrays that would benefit from such positive voltage boost pulses (e.g., fast NFET-slow PFET IC chips that will operate at a relatively low positive cell supply voltage) and wherein PVBCs are attached to the substrates of those identified chips and operably connected to the memory arrays.

Figure 3:
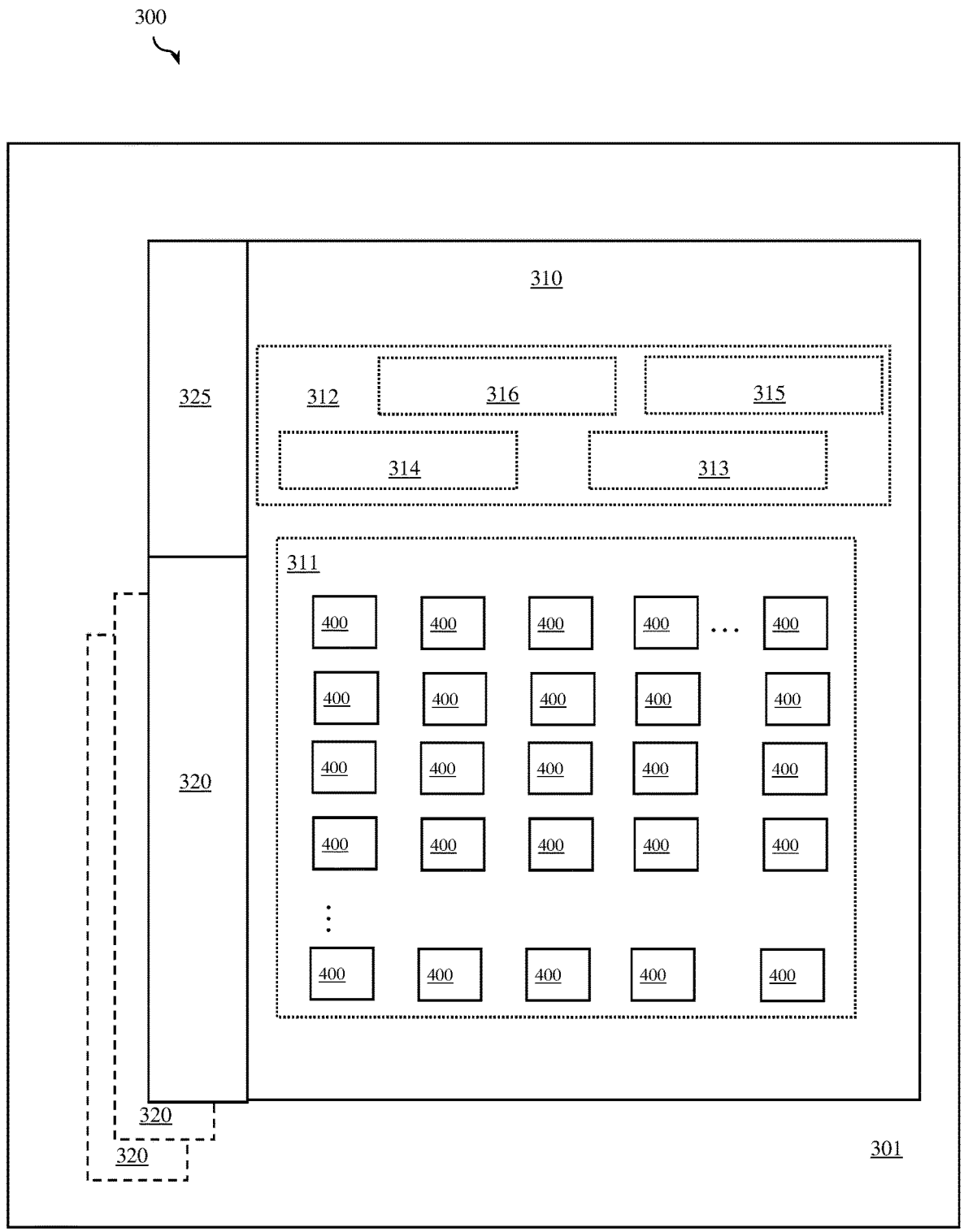
FIG. 3 is a block diagram illustrating an integrated circuit (IC) chip that includes a memory array (e.g., an SRAM array) and at least one positive voltage boost circuit for providing positive voltage boost pulses to memory cells in the memory array.

More particularly, referring to FIG. 3, disclosed herein are embodiments of an integrated circuit (IC) chip 300. The IC chip 300 can include a substrate 301. The IC chip 300 can further include, on the substrate 301, a memory circuit 310 and at least one positive voltage boost circuit (PVBC) 320, and a PVBC controller 325.

The memory circuit 310 can include a memory array 311 and peripheral circuitry 312 for the memory array 311.

Figure 4:
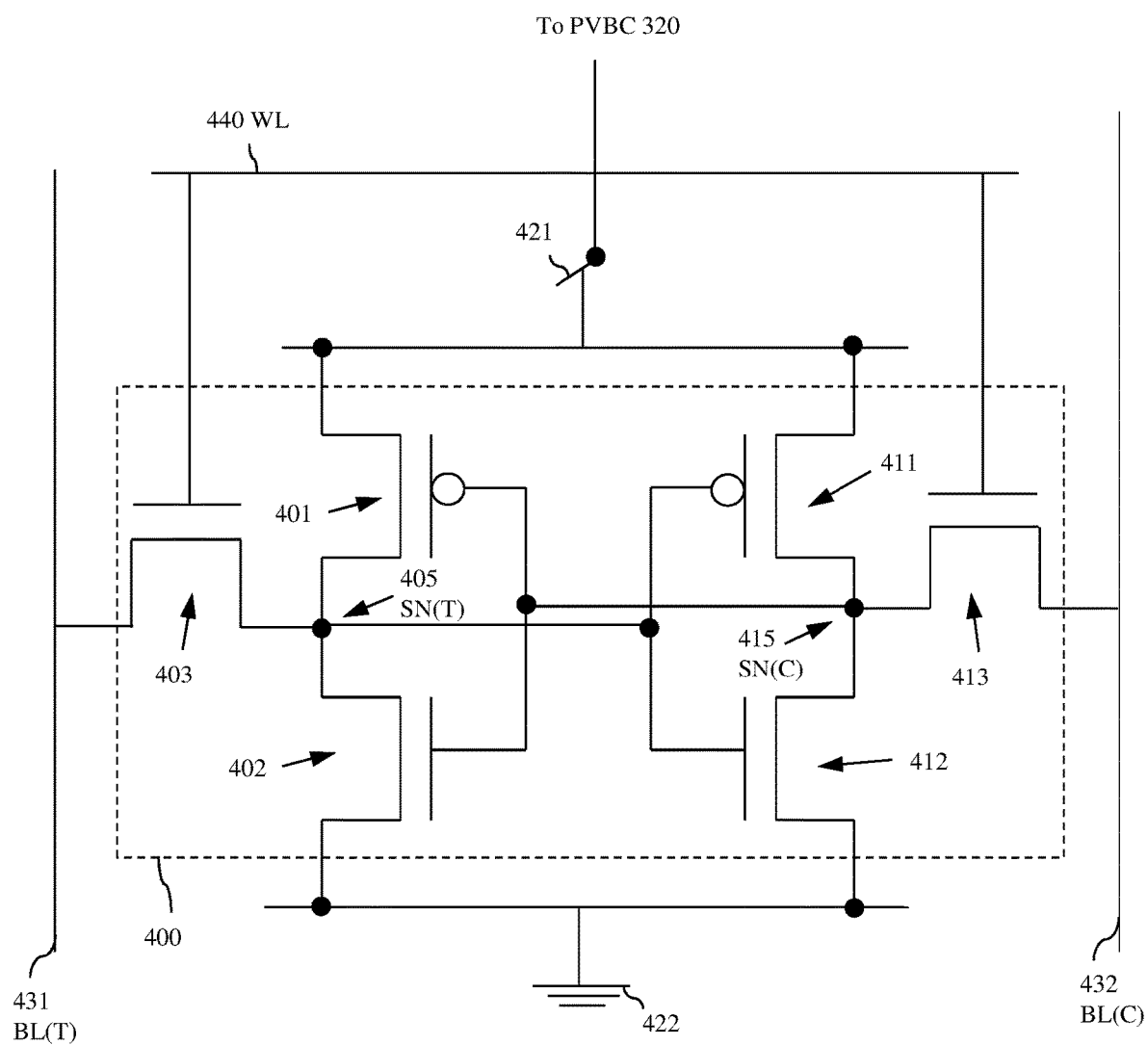
FIG. 4 is a schematic diagram illustrating an exemplary SRAM cell that can be incorporated into the memory array on the IC chip.

The memory array 311 can be, for example, a static random access memory (SRAM) array that includes SRAM cells 400 arranged in columns and rows. The SRAM cells 400 can be, for example, conventional six-transistor (6T) SRAM cells. As illustrated in FIG. 4, each SRAM cell 400 can include a pair of complementary storage nodes (i.e., storage node true 405 and storage node complement 415) and can be connected to a wordline (WL) 440 and to a pair of complementary bitlines (i.e., bitline true 431 and bitline complement 432). Specifically, each SRAM cell 400 can include a pair of inverters that are cross-coupled. The first inverter of the pair can include a first pull-up transistor 401 (e.g., a P-type field effect transistor (PFET)) and a first pull-down transistor 402 (e.g., an N-type field effect transistor (NFET)) connected in series. The source of the first pull-up transistor 401 can be electrically connected to a positive voltage rail 421, which is coupled to a PVBC 320. The source of the first pull-down transistor 402 can be electrically connected to a ground rail 422. The SRAM cell 400 can further include a first pass-gate transistor 403 (e.g., an NFET). The drain of the first pass-gate transistor 403 can be connected to a storage node true 405 at the interface between the drains of the first pull-up and pull-down transistors 401-402. The source of the first pass-gate transistor 403 can be connected to a bitline true 431, which is common to all SRAM cells in the same specific row. The second inverter of the pair can include a second pull-up transistor 411 (e.g., a P-type field effect transistor (PFET)) and a second pull-down transistor 412 (e.g., an N-type field effect transistor (NFET)) connected in series. The source of the second pull-up transistor 411 can be electrically connected to the positive voltage rail 421, which is coupled to the PVBC 320. The source of the second pull-down transistor 412 can be electrically connected to the ground rail 422. The SRAM cell 400 can further include a second pass-gate transistor 413 (e.g., an NFET). The drain of the second pass-gate transistor 413 can be connected to a storage node complement 415 at the interface between the drains of the second pull-up and pull-down transistors 411-412. The source of the second pass-gate transistor 413 can be connected to a bitline complement 432, which is common to all SRAM cells in the same specific row. The gates of the first and second pass-gate transistors 403 and 413 are connected to a wordline (WL) 440, which is common to all the SRAM cells in the same specific row.

The peripheral circuitry 312 can include circuitry that facilitates writing data values to and reading data values from the individual memory cells 400 within the memory array 311. The peripheral circuitry 312 can include, for example, a row address decoder 313 (also referred to as a wordline address decoder), wordline drivers 314, a column address decoder 315, a sensing circuit 316 (including, but not limited to, sense amplifiers, optional multiplexors, etc.) and any other peripheral circuitry that facilitates writing and/or reading operations. The components described above and included in the peripheral circuitry 312 are well known in the art and, thus, the details thereof have been omitted from this specification in order to allow the reader to focus on the salient aspects of the disclosed embodiments.

The positive voltage boost circuit(s) (PVBC(s)) 320 can be operably connected to the memory array 311 in order to provide positive voltage boost pulses to memory cells 400 in the memory array 311 substantially concurrently with wordline deactivation during write operations only (which are performed in order to store data values in the memory cells). Such pulses are provided to overcome writeability issues associated with a chip that operates, for example, at a fast n-type field effect transistor (NFET)-slow p-type field effect transistor (PFET) process corner and/or at a relatively low operating voltage. For purposes of this disclosure, a fast NFET-slow PFET process corner IC chip can be, for example, an IC chip with 6σ fast NFETs and 6σ slow PFETs or any other IC chip sorted into a group with Xσ fast NFETs and Xσ slow PFETs. Also for purposes of this disclosure, a relative low operating voltage refers to a positive cell supply voltage (PVCS) level of less than 0.75V, such as a PVCS level of approximately 0.55V.

For example, consider a specific SRAM cell, as shown in FIG. 4, which in a specific column and a specific row of the memory array 311. During a read operation, a data value stored in the storage node true 405 of the specific SRAM cell 400 is read without employing the PVBC 320, which is controlled by the PVBC controller 325. To accomplish this, the peripheral circuitry 312 operates to pre-charge the bitline true 431 and the bitline complement 432 to a first positive voltage level (referred to herein as the PVCS level) and to activate the wordline 440 (i.e., charge the wordline 440 to the same first positive voltage level) so as to turn on the first and second pass-gate transistors 403 and 413. During this read operation, the positive voltage rail 421 and, thereby the sources of the first and second pull-up transistors 401 and 411 are held at the PVCS level. When a data value of "1" is stored at storage node true 405, the bitline true 431 will remain charged at the PVCS level and the bitline complement 432 will be discharged to ground 422 through the second pull-down and pass-gate transistors 412 and 413. When a data value of "0" is stored at storage node true 405, the bitline true 432 will be discharged to ground 422 through the first pull-down and pass-gate transistors 402 and 403 and the bitline complement 432 will remain charged at the PVCS level. A sense amplifier (not shown) at the end of the specific column will sense whether the bitline true 431 or the bitline complement 432 has a higher voltage level and, thereby will sense the data value stored in the specific SRAM cell 400 (i.e., a "1" if the bitline true 431 has the higher voltage level and a "0" if the bitline complement 432 has the higher voltage level).

During a write operation, a data value can be stored in the specific SRAM cell 400 and a PVBC 320 can be employed to ensure that the write operation is completed particularly when the PVCS level is relatively low (e.g., less than 0.75V, such as at approximately 0.55V) and when the chip is operating at the fast NFET-slow PFET process corner (e.g., with such that the pull-up transistors 401 and 411 have a higher Vt of 0.515V and may struggle to turn on.

Figure 5:
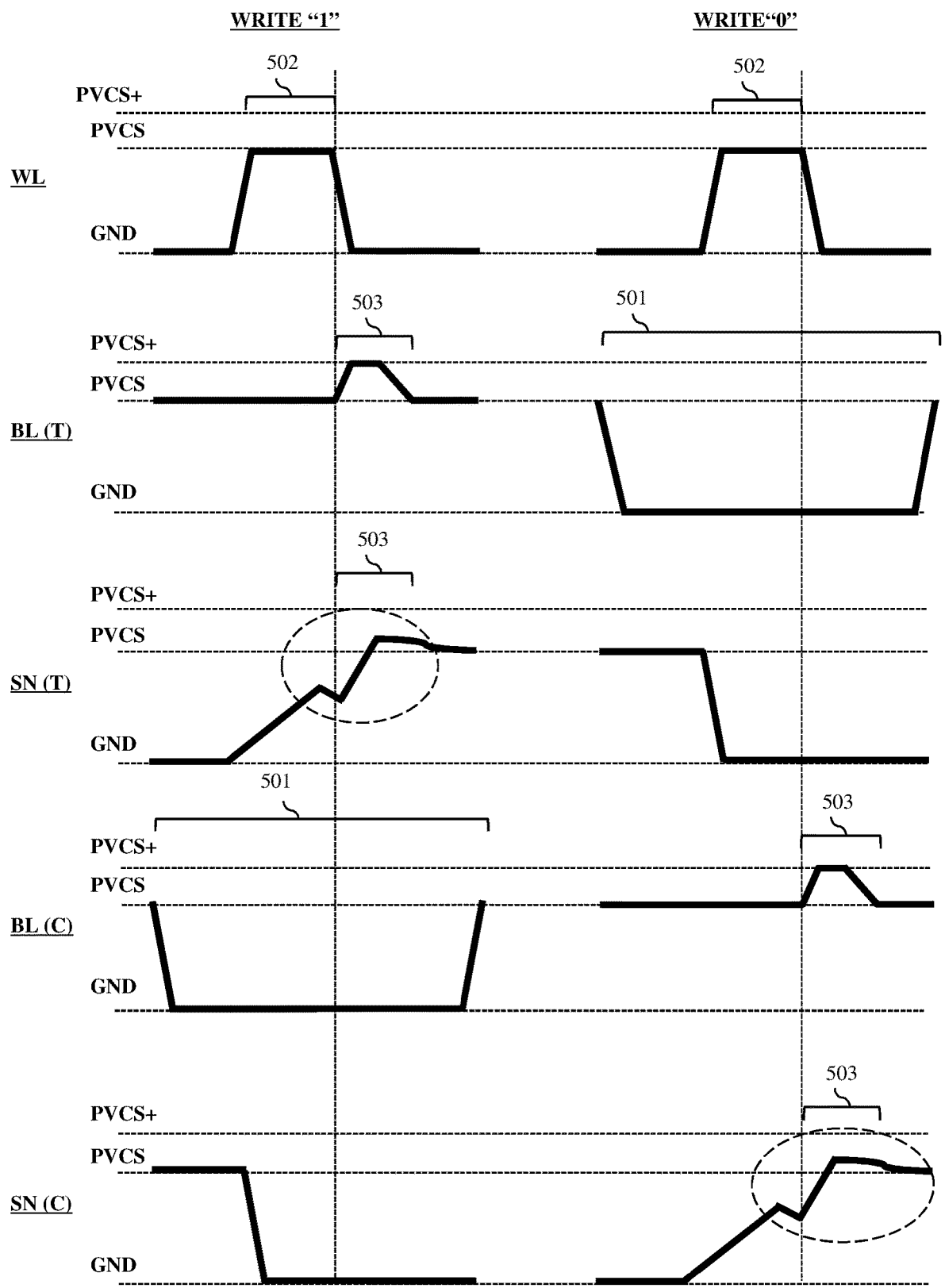
FIG. 5 is a timing diagram illustrating fast NFET-slow PFET process corner operation of an SRAM cell (e.g., as shown in FIG. 4) operating with positive voltage boost pulses provided by a positive voltage boost circuit.

As illustrated in the timing diagram of FIG. 5, to store a data value of "1" on the storage node true 405 of the specific SRAM cell 400, the peripheral circuitry 312 operates so that the bitline true 431 (BL(T)) remains charged at the PVCS level, so that the bitline complement 432 (BL(C)) is discharged to ground 422 and so that the wordline (WL) 440 is activated (i.e., charged to the PVCS level through the positive voltage rail 421). As a result, the first and second pass-gate transistors 403 and 413 are turned on, connecting the storage node true (SN(T)) 405 to the bitline true (BL(T)) 431, which is pre-charged to the PVCS level, and the storage node complement (SN(C)) 415 to the bitline complement (BL(C)) 432, which is discharged to ground. In this case, the voltage on the storage node true 405 (SN(T)) begins to increase, turning off the second pull-up transistor 411. Additionally, the voltage on the storage node complement 415 (SN(C)) is pulled down by the second pull-down and pass-gate transistors 412 and 413. A low voltage on the storage node complement 415 (SN(C)) should cause the first pull-up transistor 401 to turn on, thereby causing the voltage on the storage node true 405 (SN(T)) to be pulled up through the first pull-up transistor 401. However, to ensure that the voltage on the storage node true 405 (SN(T)) is pulled up when the first pull-up transistor 401 may be struggling to fully turn on, the PVBC controller 325 may cause the PVBC 320 to apply a positive voltage boost pulse to the positive voltage rail 421 and, thereby to the sources of the pull-up transistors 401 and 411. Application of the positive voltage boost pulse increases the voltage on the positive voltage rail 421 (e.g., by 25 mV-200 mV, such as by 100 mV) from the PVCS level (i.e., the first positive voltage level) to a a PVCS+ level (i.e., a second positive voltage level that is higher than the first positive voltage level) and, thereby increases the source voltage and hence increases the head room of first pull-up transistor 401 to speed up the turn on and allow the storage node true 405 (SN(T)) to reach at least the PVCS level prior to completion of the write operation.

Also, as illustrated in the timing diagram of FIG. 5, to store a data value of "0" on the storage node complement 405 (SN(C)), the peripheral circuitry 312 operates so that the bitline true 431 (BL(T)) is discharged to ground, the bitline complement 432 (BL(C)) is charged to the PVCS level, and the wordline (WL) 440 is activated (i.e., charged to the PVCS level through the positive voltage rail 421). As a result, the first and second pass-gate transistors 403 and 413 are turned, connecting the storage node true (SN(T)) 405 to the bitline true (BL(T)) 431, which was discharged to ground, and the storage node complement (SN(C)) 415 to the bitline complement (BL(C)) 432, which is at the PVCS level. As a result, the voltage on the storage node true 405 (SN(T)) begins to decrease, turning on the second pull-up transistor 411 and, thereby pulling up the voltage on the storage node complement 415 (SN(C)) to the PVCS level on the positive voltage rail 421. A high voltage on the storage node complement 415 (SN(C)) will turn off the first pull-up transistor 401. To ensure that the voltage on the storage node true 405 (SN(T)) is pulled down to and remains at ground (i.e., stores a data value of "0") when the second pull-up transistor 411 struggles to fully turn on, the PVBC controller 325 may cause the PVBC 320 to apply a positive voltage boost pulse to the positive voltage rail 421 and, thereby to the sources of the pull-up transistors 401 and 411. Application of the positive voltage boost pulse increases the voltage on the positive voltage rail 421 (e.g., by 25 mV-200 mV, such as by 100 mV) from the PVCS level (i.e., the first positive voltage level) to a PVCS+ level (i.e., a second positive voltage level that is higher than the first positive voltage level) and, thereby increases the source voltage and and hence increases the head room of the second pull-up transistor 411 to speed up the turn on to ensure that the storage node true 405 (SN(T)) is not pulled up above ground.

By increasing the head room of the pull-up transistors 401 and 411, as described above, during the write operations, the structure ensures that the process of writing either a data value of a "1" or a data value of a "0" to the storage node true 405 (SN(T)) of a specific SRAM cell 400 is completed within the allotted time even in the case of a IC chip operating at the fast NFET-slow PFET process corner and at a low operating voltage (e.g., at a PVCS level of less than 0.75V, such as at approximately 0.55V). It should be noted that this positive voltage boost pulse can be a relatively short pulse (e.g., a 0.2-0.5 nanosecond (ns) pulse) and, more particularly, the positive voltage boost pulse can be timed so that it occurs essentially concurrently with deactivation of the wordline 440 (i.e., discharging of the wordline 440 to ground) during the write operation to avoid application of the positive voltage boost pulse to the wordline 440 and also so that the pulse is finished prior to when the bitline true or bitline complement is restored (i.e., recharged back to the PVCS level at the end of the write operation). Applying the positive voltage boost pulse at wordline deactivation and completing the pulse prior to bitline restoration ensures that the pulse will not adversely impact cell stability or cycle times.

Figure 6:
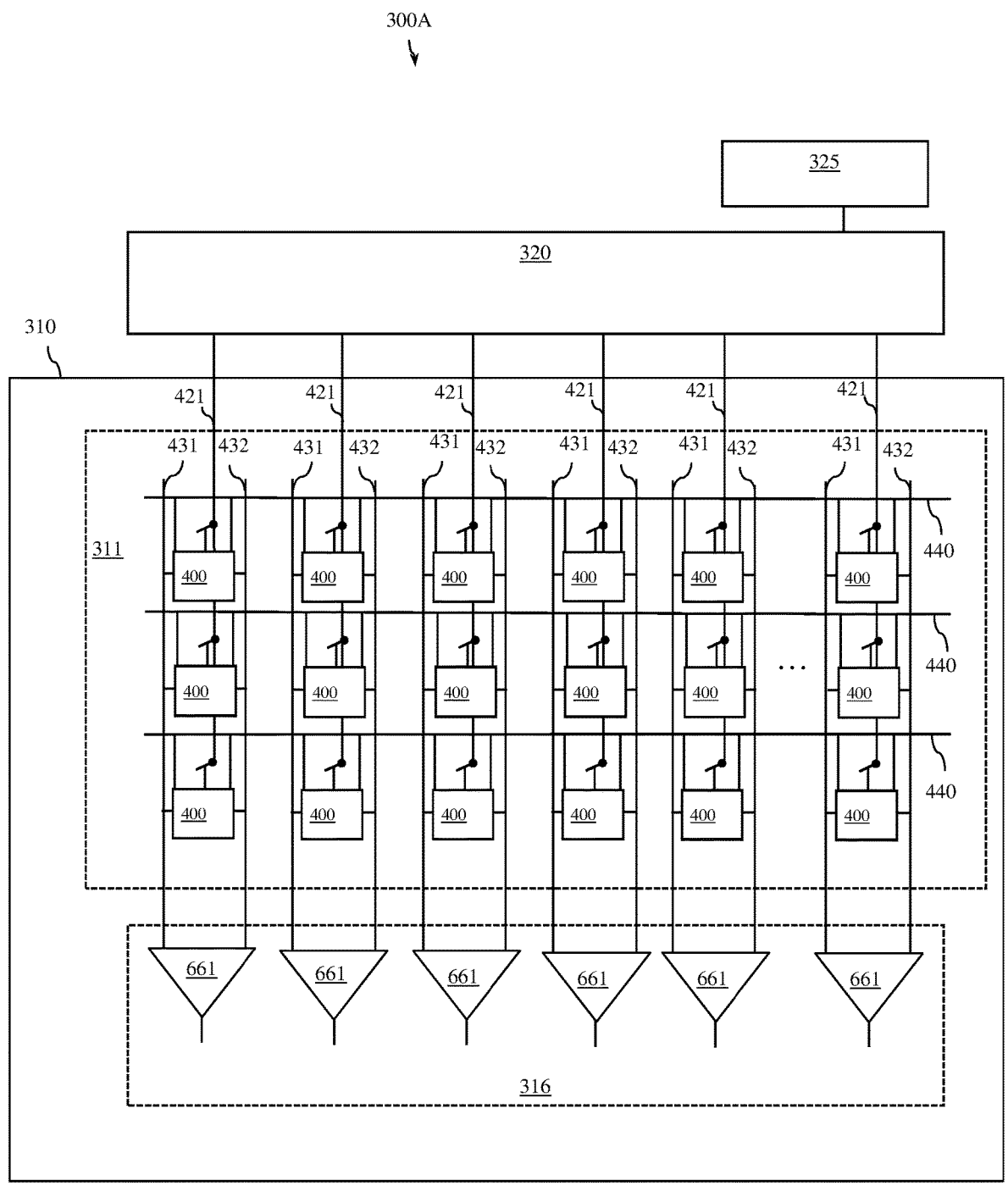
FIG. 6 is a schematic drawing illustrating portions of one embodiment of the IC chip, which includes a single positive voltage boost circuit.

FIG. 6 is a schematic drawing illustrating relevant portions of one embodiment of an IC chip 300A, which includes a single positive voltage boost circuit (PVBC) 320 controlled by the PVBC controller 325. As illustrated, the sensing circuit 316 includes sense amplifiers 661, which are at the end of each column and which compare the voltages on the bitlines 431-432 during read operations. In this embodiment 300A, each data bit column includes a single column of memory cells. In this case, the output of the single PVBC 320, which is controlled by the PVBC controller 325, is connected to the positive voltage rails 421 for all the columns in the memory array. Thus, all memory cells across the memory array are simultaneously subjected to the above-described positive voltage boost pulses at the PVCS+ level during the write operation.

Optionally, in order to minimize power consumption, IC chips may contain multiple PVBCs and each PVBC can apply positive voltage boost pulses to the positive voltage rails 421 of the memory cells in specific columns only (i.e., not all columns).

Figure 7:
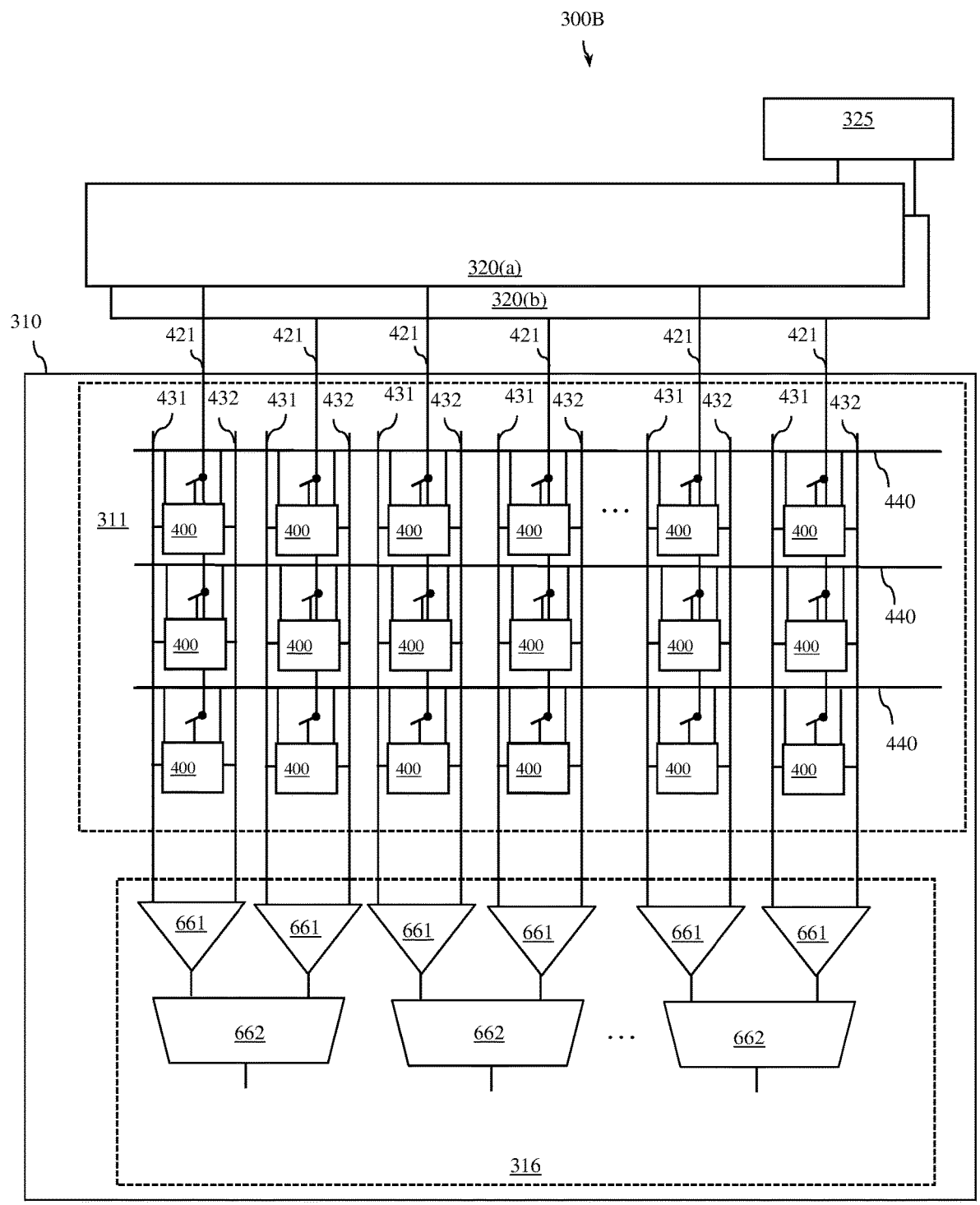
FIG. 7 is a schematic drawing illustrating portions of another embodiment of the IC chip, which includes two positive voltage boost circuits.

For example, FIG. 7 is a schematic drawing illustrating relevant portions of another embodiment of an IC chip 300B, which includes two PVBCs 320(a) and 320(b), which are both controlled by the PVBC controller 325. In this embodiment 300B, each data bit column can include a pair of adjacent columns of memory cells (i.e., an even column and an odd column) and the sensing circuit 316 can include sense amplifiers 661, which are at the end of each column and which compare the voltages on the bitlines 431-432 during read operations, and also multiple 2-input multiplexors 662. Each 2-input multiplexor can be operably connected to a corresponding pair of adjacent columns. Specifically, each 2-input multiplexor can receive, as inputs, the data output from two adjacent sense amplifiers 661 of the two adjacent columns of a data bit column. In this case, a first PVBC 320(a) can be connected to the positive voltage rails 421 of only the even columns in the memory array 311 and a second PVBC 320(b) can be connected to the positive voltage rails 421 of only the odd columns in the memory array 311. With this configuration, when a data value is being written to a specific memory cell in an even column, then only the memory cells in the even columns will be simultaneously subjected to the above-described positive voltage boost pulses at the PVCS+ level during the write operation and the memory cells in the odd columns will be held at the PVCS level, and vice versa.

Figure 8:
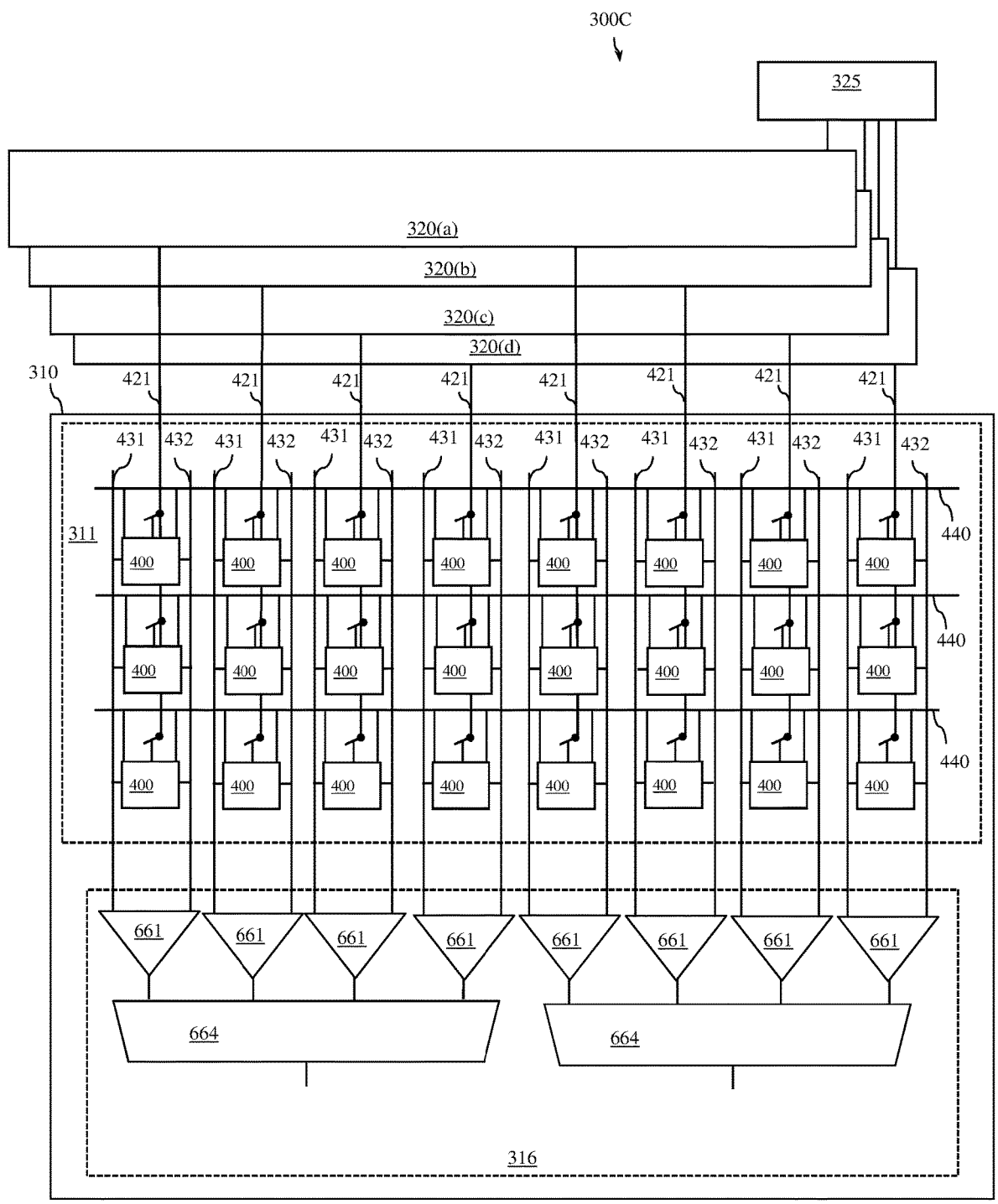
FIG. 8 is a schematic drawing illustrating portions of yet another embodiment of the IC chip, which includes four positive voltage boost circuits.

Similarly, FIG. 8 is a schematic drawing illustrating relevant portions of another embodiment of an IC chip 300C, which includes four PVBCs 320(a)-320(d), which are controlled by the PVBC controller 325. In this embodiment 300C, each data bit column can include four adjacent columns of memory cells (i.e., a first column, a second column, a third column and a fourth column) and the sensing circuit 316 can include sense amplifiers 661, which are at the end of each of the columns and which compare the voltages on the bitlines 431-432 during read operations, and also multiple 4-input multiplexors 664. Each 4-input multiplexor can be operably connected to a corresponding set of four adjacent columns. Specifically, each 4-input multiplexor can receive, as inputs, the data output from four adjacent sense amplifiers 661 of the four adjacent columns of a data bit column. In this case, a first PVBC 320(a) can be connected to the positive voltage rails 421 of every first column in every data bit column in the memory array 311, a second PVBC 320(b) can be connected to the positive voltage rails of every second column of every data bit column in the memory array 311, a third PVBC 320(c) can be connected to the positive voltage rails of every third column of every data bit column in the memory array 311, and a fourth PVBC 320(d) can be connected to the positive voltage rails of every fourth column in every data bit column in the memory array 311. With this configuration, when a data value is being written to a specific memory cell in a first column of a data bit column, then only the memory cells in the first columns of each data bit column will be simultaneously subjected to the above-described positive voltage boost pulses at the PVCS+ level during the write operation and the memory cells in all the other columns will be held at the PVCS level; when a data value is being written to a specific memory cell in a second column of a data bit column, then only the memory cells in the second columns of each data bit column will be simultaneously subjected to the above-described positive voltage boost pulses at the PVCS+ level during the write operation and the memory cells in all the other columns will be held at the PVCS level; and so on.

Figure 9:
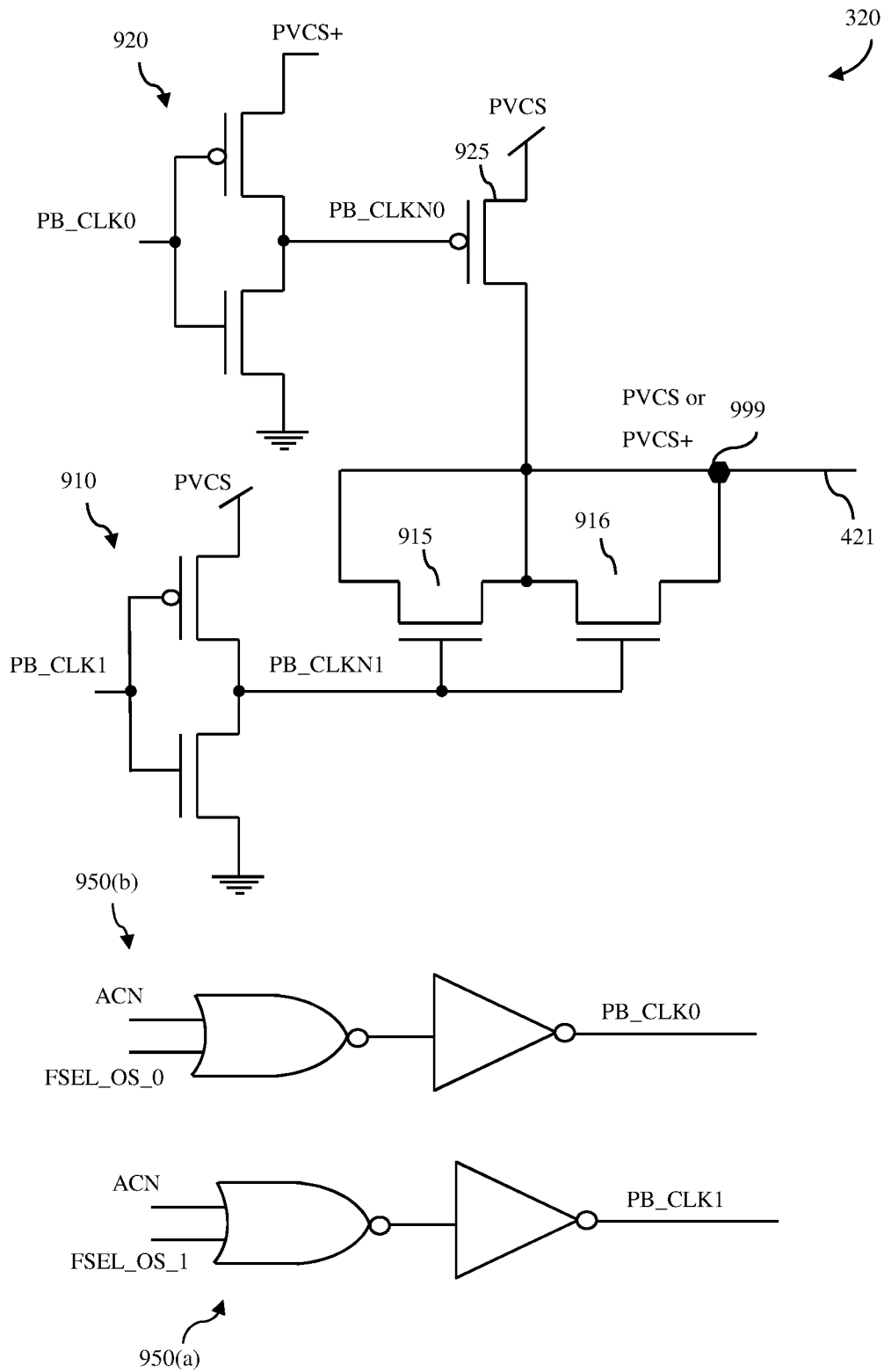
FIG. 9 is a schematic diagram illustrating an exemplary positive voltage boost circuit that can provide positive voltage boost pulses to the memory cells in the memory array.
Figure 10:
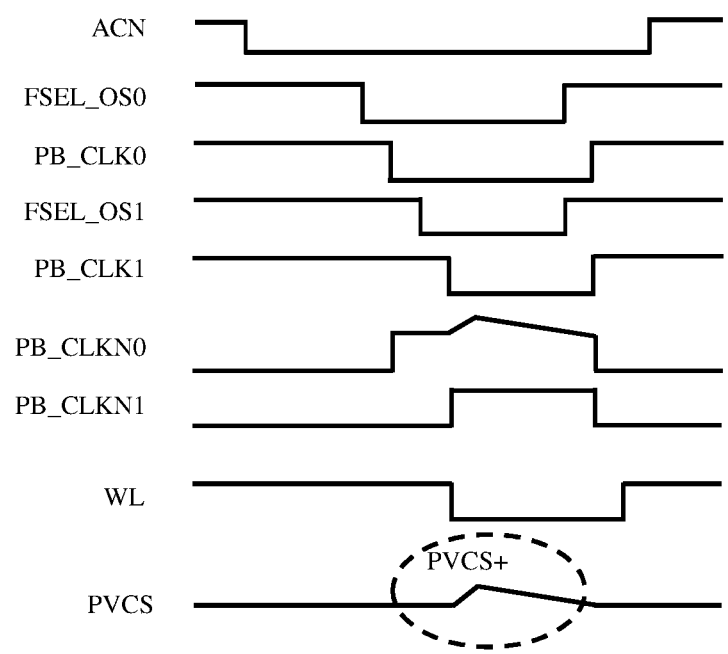
FIG. 10 is a timing diagram illustrating the timing of the different signals shown in FIG. 9 as well as the corresponding timing of the voltage on a wordline.

FIG. 9 is a schematic diagram illustrating an exemplary PVBC 320 that can be incorporated into the IC chip 300 of FIG. 3 (including into any of the various different embodiments 300A-300C shown in greater detail in FIGS. 6-8) and FIG. 10 is a timing diagram illustrating the timing of the different signals shown in FIG. 9 as well as the corresponding timing on the wordline. The PVBC 320 can include an output node 999 that is held at the PVCS level (i.e., the first positive voltage level) except for a very short period of time during the write operation, when it switches over to a PVCS+ level (i.e., a second positive voltage level that is higher than the first positive voltage level). The PVBC 320 can include a first inverter 910, which includes high threshold voltage transistors and which is connected between a first positive voltage supply at the PVCS level and ground, and a second inverter 920, which similarly includes high threshold voltage (Vt) transistors and which is connected between a second positive voltage supply at the higher PVCS+ level and ground. A first output node of the first inverter 910 controls a pair of series connected low Vt NFETs 915-916 that are connected in a feedback loop with the drain of the first low Vt NFET 915 being connected to the drain of the second low Vt NFET 916 and also connected to the output node 999 and with the source of the second low Vt NFET also being connected to the output node 999. The second output node of the second inverter 920 controls a low Vt PFET 925, which is connected between the first positive voltage supply and the feedback loop.

Timing of the write operation is performed using multiple different clock signals. Specifically, timing of when the output node 999 switches between these two voltage levels is determined based on two discrete clock signals: PB_CLK1 and PB_CLK0. PB_CLK1 can control the gates of the PFET and NFET in the first inverter 910 and can be generated by clock signal generator 950(a) based on a control clock signal FSEL_OS_1 and a column select signal ACN received from the PVBC controller 325. PB_CLK0 can control the gates of the PFET and NFET in the second inverter 920 and can be generated by another clock signal generator 950(b) based on another control clock signal FSEL_OS_0 and the same column select signal ACN received from the PVBC controller 325.

The PVBC controller 325 in combination with the PVBC 320 of FIG. 9 ensure that the switch between the PVCS level and the PVCS+ level at the output node 999 occurs, during a write operation only and essentially concurrently with deactivation of the wordline (i.e., when the wordline is discharged to ground), as illustrated in the timing diagram of FIG. 10, and further ensure that this switch is for a relatively short period of time so that the applied positive voltage boost pulse is finished before the bitlines are restored to the PVCS level. For example, the positive voltage boost pulses can be 0.2-0.5 ns positive voltage boost pulses. Thus, the write operation can be performed using multiple different input signals (e.g., column select signal ACN and clock signals PB_CLK0, and PB_CLK_1). As illustrated in the timing diagram of FIG. 5, these multiple different input signals ensure that the discharging and the recharging of either the bitline complement (BL(C)) in a write "1" operation or the bitline true (BL(T)) in a write "0" operation occur at a beginning and end, respectively, of a first time period 501, such that the charging and the discharging of the wordline occur in a second time period 502 that is during and shorter than the first time period 501, and such that the applying of the positive voltage boost pulse occurs in a third time period 503 that is during and shorter than the first time period 501 and that overlaps an end of the second time period 502. As mentioned above, applying the positive voltage boost pulse at wordline deactivation and completing the pulse prior to bitline restoration ensures that the pulse will not adversely impact cell stability or cycle times.

Although not shown in the circuit timing diagrams, additionally or alternatively, the IC chip could include, on the substrate, negative voltage boost circuit(s) (NVBC) operably connected to the memory array 311 and used to improve writeability within memory cells when, for example, the memory array operates using a relatively low positive cell supply voltage and the chip is manufactured at the slow NFET-fast PFET process corner. Such a NBVC can provide negative voltage boost pulses to the sources of pull-down transistors in the memory cells during write operations to store data values in those memory cells and, more specifically, can provide such negative voltage boost pulses prior to wordline deactivation during the write operations to ensure that the write operations are completed and the stored data value is stable.

Figure 11:
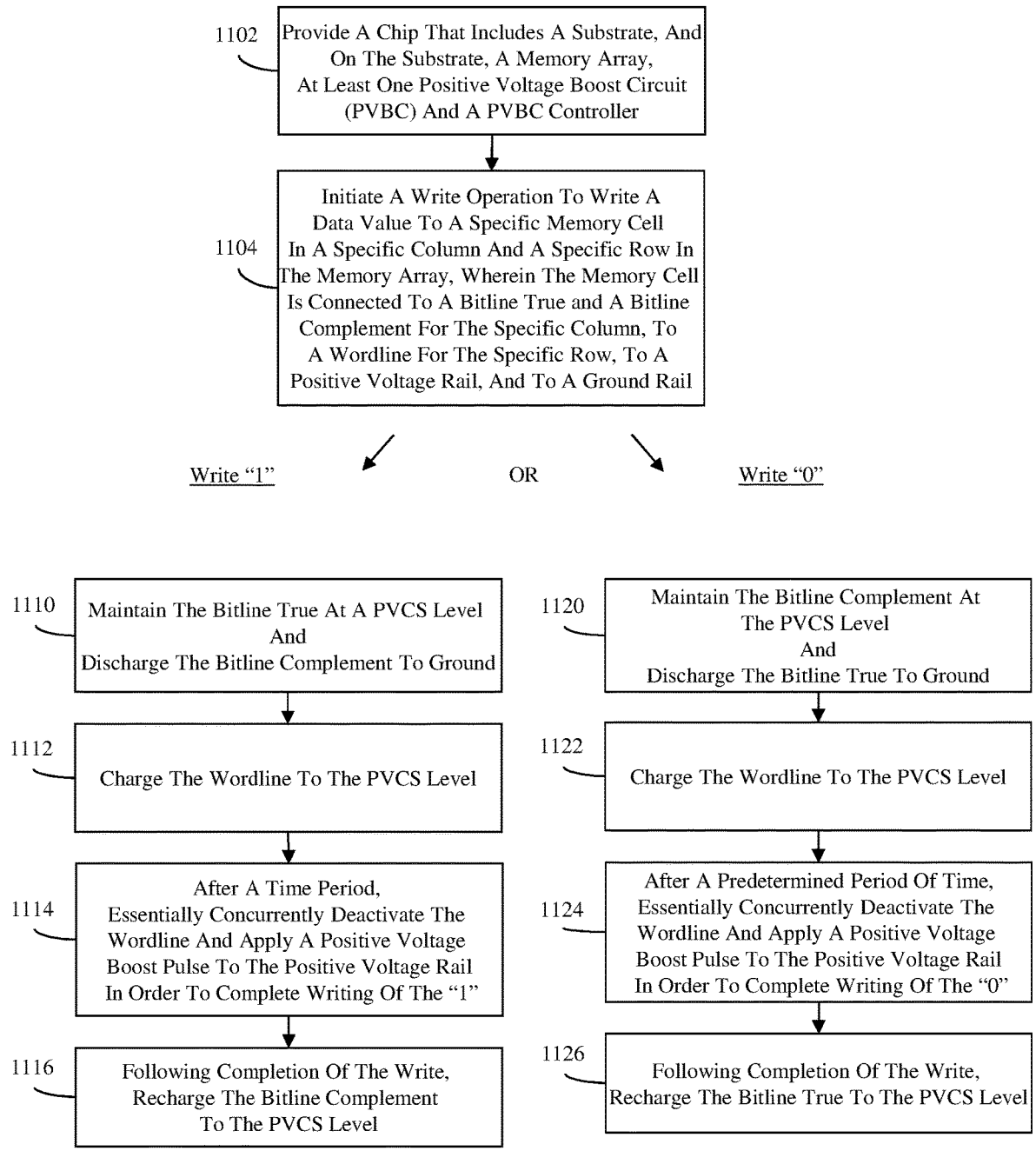
FIG. 11 is a flow diagram illustrating embodiments of memory array operating method.

Referring to the flow diagram of FIG. 11, also disclosed herein are embodiments of memory array operating method. Specifically, the method can include providing an integrated circuit (IC) chip, such as the IC chip 300 described in detail above and illustrated in FIG. 3 (see process 1102). The IC chip 300 can have a substrate 301 and a memory circuit 310 on the substrate. The memory circuit 310 can include a memory array 311 (e.g., a static random access memory (SRAM) array) with columns and rows of memory cells 400 (e.g., static random access memory (SRAM) cells, as illustrated in FIG. 4, and described in detail above). The memory circuit 310 can further include the peripheral circuitry 312 needed to facilitate writing data values to and reading data values from the individual memory cells 400 within the memory array 311. The IC chip 300 can further include at least one positive voltage boost circuit (PVBC) 320 operably connected to the memory array 311 for providing positive voltage boost pulses to memory cells 400 in the memory array 311 substantially concurrently with wordline deactivation during write operations performed in order to store data values in the memory cells.

The method can further include performing a write operation to write a data value (e.g., a "1" or a "0") to a specific memory cell in a specific column and a specific row of the memory array 311 and, during the write operation, using a PVBC 320 to provide a positive voltage boost pulse to improve writeability (see process 1104 and FIG. 4). Specifically, in the memory array, the specific memory cell 400 can be connected to both a bitline true 431 and a bitline complement 432 for the specific column, to a wordline 440 for the specific row, to a positive voltage rail 421 and to a ground rail 422.

As illustrated in the timing diagram of FIG. 5, to store a data value of "1" on the storage node true 405 of the specific SRAM cell 400, the bitline true 431 (BL(T)) can be maintained at a first positive voltage level (i.e., referred to herein as the positive cell supply voltage (PVCS) level) and the bitline complement 432 (BL(C)) can be discharged to ground 422 (see process 1110). Next, the wordline (WL) 440 can be activated (i.e., charged to the PVCS level through the positive voltage rail 421) (see process 1112). As a result, the first and second pass-gate transistors 403 and 413 are turned on, connecting the storage node true (SN(T)) 405 to the bitline true (BL(T)) 431, which is pre-charged to the PVCS level, and the storage node complement (SN(C)) 415 to the bitline complement (BL(C)) 432, which is discharged to ground. In this case, the voltage on the storage node true 405 (SN(T)), which is held at VCS, turns off the second pull-up transistor 411. Additionally, the voltage on the storage node complement 415 (SN(C)) is pulled down by the second pull-down and pass-gate transistors 412 and 413. A low voltage on the storage node complement 415 (SN(C)) should cause the first pull-up transistor 401 to turn on, thereby causing the voltage on the storage node true 405 (SN(T)) to be pulled up through the first pull-up transistor 401. However, to ensure that the voltage on the storage node true 405 (SN(T)) is pulled up when the first pull-up transistor 401 may be struggling to fully turn on, a positive voltage boost pulse is applied by a PVBC 320 to the positive voltage rail 421 and, thereby to the sources of the pull-up transistors 401 and 411 (see process 1114). Application of the positive voltage boost pulse increases the voltage on the positive voltage rail 421 (e.g., by 25 mV-200 mV, such as by 100 mV) from the PVCS level to a PVCS+ level (i.e., a second positive voltage level that is higher than the first positive voltage level) and, thereby increases the source voltage and increases the headroom of first pull-up transistor 401 to speed up the turn on and allow the storage node true 405 (SN(T)) to reach at least the PVCS level prior to completion of the write operation. After the data value of "1" is written to the storage node true (SN(T)), the bitline complement 432 is restored (i.e., recharged to the PVCS level) (see process 1116).

Also, as illustrated in the timing diagram of FIG. 5, to store a data value of "0" on the storage node true 405 (SN(T)), the bitline true 431 (BL(T)) is discharged to ground and the bitline complement 432 (BL(C)) is charged to the PVCS level (see process 1120). Next, the wordline (WL) 440 is activated (i.e., charged to the PVCS level through the positive voltage rail 421) (see process 1122). As a result, the first and second pass-gate transistors 403 and 413 are turned, connecting the storage node true (SN(T)) 405 to the bitline true (BL(T)) 431, which was discharged to ground, and the storage node complement (SN(C)) 415 to the bitline complement (BL(C)) 432, which is at the PVCS level. As a result, the voltage on the storage node true 405 (SN(T)) begins to decrease, turning on the second pull-up transistor 411 and, thereby pulling up the voltage on the storage node complement 415 (SN(C)) to the PVCS level on the positive voltage rail 421. A high voltage on the storage node complement 415 (SN(C)) will turn off the first pull-up transistor 401. To ensure that the voltage on the storage node true 405 (SN(T)) is pulled down to and remains at ground (i.e., stores a data value of "0") when the second pull-up transistor 411 struggles to fully turn on, a positive voltage boost pulse is applied to the positive voltage rail 421 and, thereby to the sources of the pull-up transistors 401 and 411 (see process 1124). Application of the positive voltage boost pulse increases the voltage on the positive voltage rail 421 (e.g., by 25 mV-200 mV, such as by 100 mV) from the PVCS level to the PVCS+ level and, thereby increases the source voltage and increases the headroom of the second pull-up transistor 411 to speed up the turn on to ensure that the storage node true 405 (SN(T)) is not pulled up above ground. After the data value of "1" is written to the storage node true (SN(T)), the bitline complement 432 is restored (i.e., recharged to the PVCS level) (see process 1126).

By speeding up the turn on times of the pull-up transistors 401 and 411, as described above, during the write operations, the method ensures that the process of writing either a data value of a "1" or a data value of a "0" to the storage node true 405 (SN(T)) of a specific SRAM cell 400 is completed within the allotted time even in the case of a IC chip operating at the fast NFET-slow PFET process corner and at a low operating voltage (e.g., at a PVCS level of less than 0.75V, such as at approximately 0.55V). It should be noted that this positive voltage boost pulse can be a relative short pulse (e.g., a 0.2-0.5 ns pulse) and, more particularly, the positive voltage boost pulse can be timed so that it occurs at process 1114 (or 1124) essentially concurrently with deactivation of the wordline 440 (i.e., discharging of the wordline 440 to ground) during the write operation to avoid application of the positive voltage boost pulse to the wordline 440 and also so that the pulse is finished prior to when the true or complement other j bitline is restored at process 1116 (or 1126). Applying the positive voltage boost pulse at (i.e., concurrently with) wordline deactivation at process 1114 (or 1124) and completing the pulse prior to bitline restoration at process 1116 (or 1126) ensures that the pulse will not adversely impact cell stability or cycle times.

The method can further include performing a read operation to read a data value stored in the storage node true 405 of the specific SRAM cell 400 and doing so without employing the PVBC 320. To accomplish this, the bitline true 431 and the bitline complement 432 are pre-charged to the the PVCS level and the wordline 440 is activated (i.e., charge to the same PVCS level) so as to turn on the first and second pass-gate transistors 403 and 413. During this read operation, the positive voltage rail 421 and, thereby the sources of the first and second pull-up transistors 401 and 411 are held at the PVCS level. When a data value of "1" is stored in the storage node true 405, the bitline true 431 will remain charged at the PVCS level and the bitline complement 432 will be discharged to ground 422 through the second pull-down and pass-gate transistors 412 and 413. When a data value of "0" is stored on the storage node true 405, the bitline true 432 will be discharged to ground 422 through the first pull-down and pass-gate transistors 402 and 403 and the bitline complement 432 will remain charged at the PVCS level. A voltage difference between the bitline true 431 and the bitline complement 432 can be sensed (e.g., using sense amplifiers at the ends of the columns) to determine the data value stored in the specific SRAM cell 400 (i.e., a "1" if the bitline true 431 has the higher voltage level and a "0" if the bitline complement 432 has the higher voltage level).

Figure 12:
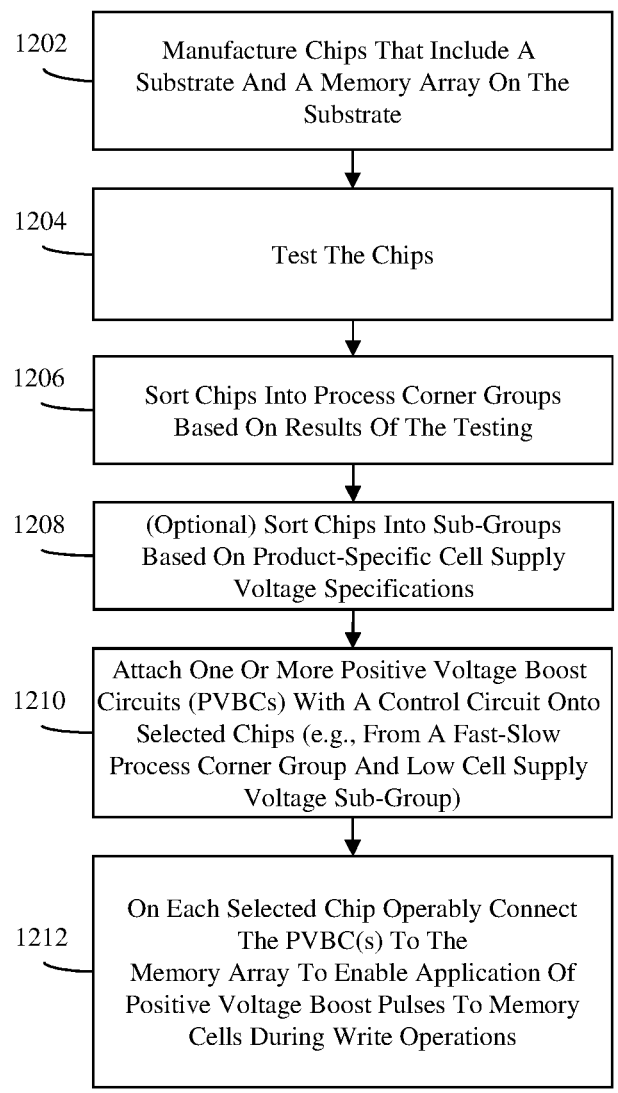
FIG. 12 is a flow diagram illustrating embodiments of an IC chip manufacturing method that includes attaching positive voltage boost circuit(s) onto selected IC chips.
Figure 13:
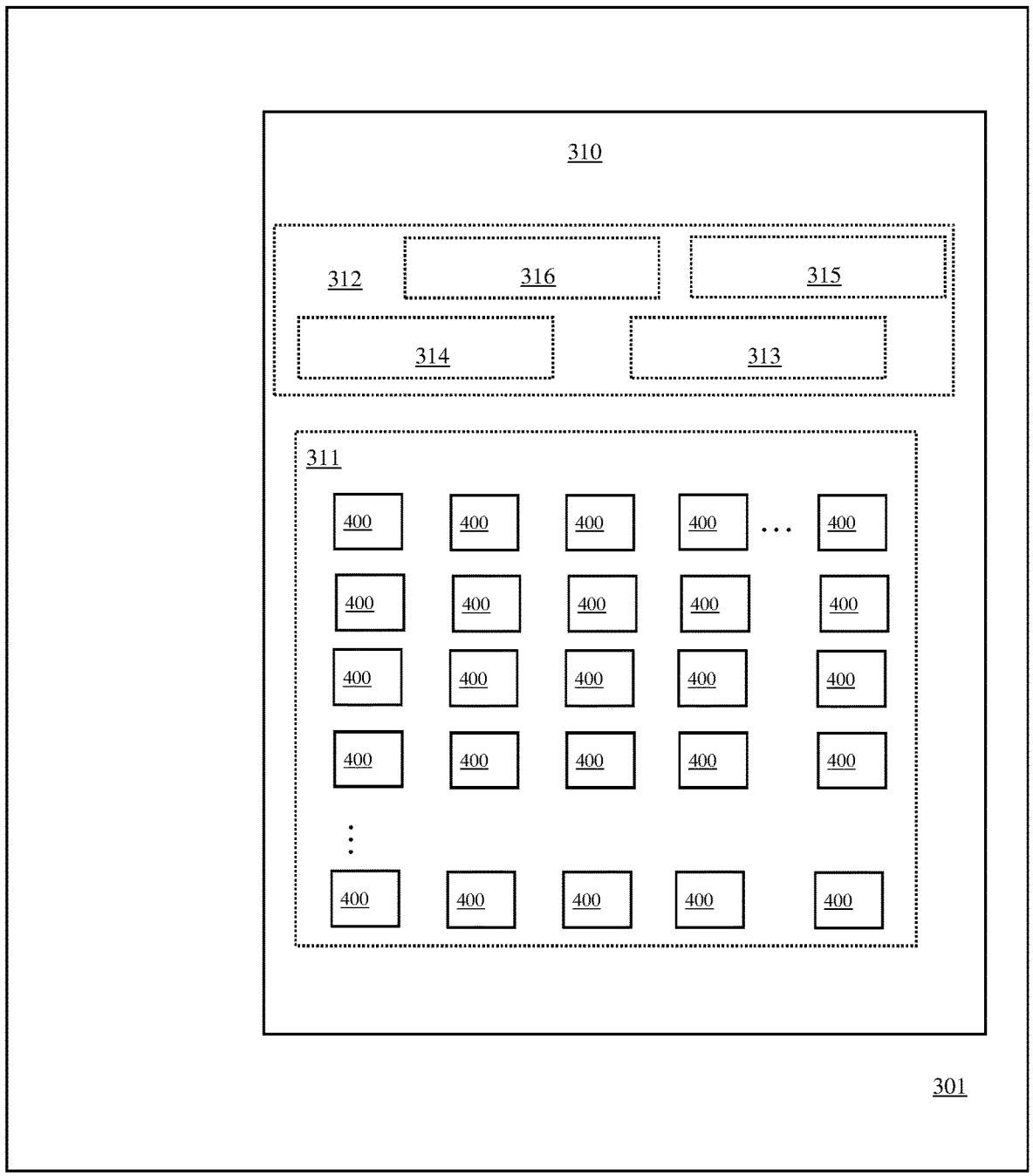
FIG. 13 is a block diagram illustrating an IC chip manufactured at process 1202 of the flow diagram of FIG. 12 and subsequently tested and sorted at processes 1204-1210 before determining whether or not positive voltage boost circuit(s) should be attached thereto so as to form the final IC chip structure shown in FIG. 3.

Finally, referring to the flow diagram of FIG. 12, also disclosed herein are embodiments of a manufacturing method, wherein post-manufacture testing is performed to identify integrated circuit chips having memory arrays that would benefit from such positive voltage boost pulses (e.g., fast n-type field effect transistor (NFET)-slow p-type field effect transistor (PFET) process corner integrated circuit (IC) chips that will operate at a relatively low positive cell supply voltage) and wherein positive voltage boost circuits are attached (e.g., affixed, fastened, stuck, etc.) to the substrate of those identified chips and operably connected to the memory arrays. Specifically, this method can include manufacturing integrated circuit (IC) chips according to an IC design (see process 1202 and FIG. 13). Each IC chip can have a substrate 301 and a memory circuit 310 on the substrate, as described in detail above. The memory circuit 310 can include a memory array 311 (e.g., a static random access memory (SRAM) array) with columns and rows of memory cells 400 (e.g., static random access memory (SRAM) cells, as illustrated in FIG. 4, and described in detail above). The memory circuit 310 can further include the peripheral circuitry 312 needed to facilitate writing data values to and reading data values from the individual memory cells 400 within the memory array 311. It should be noted that at this point in the manufacturing method voltage boost circuits are not included on the IC chips.

This method can further include testing the IC chips to determine the switching speeds of the N-type field effect transistors (NFETs) and the P-type field effect transistors (PFETs) on the IC chips and, particularly, in the memory cells 400 of the memory array 311 (see process 1204). For example, this testing is performed to identify IC chips with fast NFETs, IC chips with typical NFETs and IC chips with slow NFETs and to also identify IC chips with fast PFETs, IC chips with typical PFETs, and IC chips with slow PFETs. Techniques for testing IC chips are well known in the art and, thus, the details of such techniques have been omitted from the specification in order to allow the reader to focus on the salient aspects of the disclosed methods.

The IC chips can then be sorted into groups, based on results of the testing (see process 1206). For example, the groups can include different process corner groups and, particularly, one or more groups containing IC chips that operate at one or more of the different process corners. Those skilled in the art will recognize that the different process corners generally include the fast-fast process corner, the slow-slow process corner, the typical-typical process corner, the slow-fast process corner and the fast NFET-slow PFET process corner. Furthermore, when referring to these process corners the switching speed indication (i.e., fast, slow or typical) refers to the NFETs and the second switching speed indication refers to the PFETs. In any case, the IC chips can be sorted into groups and these groups can at least include a fast NFET-slow PFET process corner group, which contains IC chips that have fast NFETs and slow PFETs. As mentioned above, for purposes of this disclosure, a fast NFET-slow PFET process corner IC chip can be, for example, an IC chip with 6σ fast NFETs and 6σ slow PFETs or any other IC chip sorted into a group with Xσ fast NFETs and Xσ slow PFETs.

The IC chips can, optionally, further be sorted into sub-groups based on product-specific cell supply voltage specifications (see process 1208). Specifically, the IC chips within the fast NFET-slow PFET process corner group can be sorted into sub-groups based on product-specific positive cell supply voltage specifications (i.e., product-specific maximum PVCS levels). These sub-groups can include at least a first sub-group with a first maximum PVCS level (also referred to herein as a first maximum cell supply voltage) and a second sub-group with a second maximum PVCS level (also referred to herein as a second maximum cell supply voltage) that is higher than the first maximum PVCS level. The first maximum PVCS level of the IC chips in the first sub-group (i.e., the lower PVCS sub-group) can be, for example, less than 0.75V. The second maximum PVCS of the IC chips in the second sub-group (i.e., the higher PVCS sub-group) can be, for example, equal to or greater than 0.75V.

This method can further include selecting one or more IC chips from the groups and/or sub-groups and attaching (e.g., affixing, fastening, sticking, etc.) one or more positive voltage boost circuits (PVBCs) 320 and PVBC controller 325 to the edge of the substrate 301 of each selected IC chip (see process 1210 and FIG. 3). The selected IC chips can be, for example, IC chips that would benefit from the use of a PVBC. Such IC chips would include, for example, IC chips from the fast NFET-slow PFET process corner group and/or from the first sub-group (i.e., the lower PVCS level sub-group). Then, on each selected IC chip, the PVBC(s) 320 can be operably connected to the memory array 311 so as to enable the application of positive voltage boost pulses (detailed above) to memory cells in the memory array substantially concurrently with wordline deactivation during write operations to store data values in the memory cells in order to improve writeability (see process 1212).

As described in detail above and illustrated in FIG. 6, in one embodiment a single PVBC 320 can be attached (e.g., affixed, fastened, stuck, etc.) to the substrate and operably connected to the memory array at processes 1210-1212. In this case, the output of the single PVBC 320, which is controlled by the PVBC controller 325, is connected to the positive voltage rails 421 for all the columns in the memory array. Thus, all memory cells across the memory array are simultaneously subjected to the above-described positive voltage boost pulses at the PVCS+ level during the write operation.

However, optionally as described in detail above and illustrated in FIG. 7 or 8, in order to minimize power consumption, multiple PVBCs can be attached (e.g., affixed, fastened, stuck, etc.) to the substrate and operably connected to the memory array at processes 1210-1212 such that each PVBC applies positive voltage boost pulses to the positive voltage rails of the memory cells in specific columns only (i.e., not all columns).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit chip comprising:
   a substrate;
   a memory array on the substrate; and
   at least one positive voltage boost circuit on the substrate and operably connected to the memory array,
   wherein the positive voltage boost circuit provides positive voltage boost pulses to memory cells in the memory array substantially concurrently with wordline deactivation during write operations to store data values in the memory cells such that, as a wordline is being discharged from a first positive voltage level to ground during a write operation, a positive cell supply voltage is being increased from the first positive voltage level to a second positive voltage level that is greater than the first positive voltage level.

2. The integrated circuit chip of claim 1, wherein a positive voltage boost pulse increases the positive cell supply voltage by 25 mV-200 mV.

3. The integrated circuit chip of claim 1, wherein the positive voltage boost pulses comprise 0.2-0.5 ns pulses.

4. The integrated circuit chip of claim 1,
   wherein the memory array comprises columns and rows of memory cells,
   wherein, within the memory array, a specific memory cell is connected to a bitline true and a bitline complement for a specific column, to a wordline for a specific row, and to a positive voltage rail,
   wherein, prior to a write operation to write a data value to the specific memory cell the bitline true and the bitline complement are charged to the first positive voltage level and the wordline is discharged to ground, and
   wherein, during the write operation,
      the bitline true is maintained at the first positive voltage level,
      the bitline complement is discharged to ground,
      the wordline is charged to the first positive voltage level such that writing of the data value is initiated, and
      subsequently, the wordline is discharged to ground and a positive voltage boost pulse is applied to a positive voltage rail electrically connected to sources of pull-up transistors in the specific memory cell, wherein discharge of the wordline and application of the positive voltage boost pulse occur substantially concurrently so as to increase a positive cell supply voltage on the positive voltage rail from the first positive voltage level to the second positive voltage level that is higher than the first positive voltage level and ensure that the writing of the data value is completed.

5. The integrated circuit chip of claim 4, wherein the first positive voltage level is less than 0.75V.

6. The integrated circuit chip of claim 4, wherein the specific memory cell comprises a six-transistor static random access memory cells comprising:
   a first pull-up transistor with a first source connected to the positive voltage rail and a first drain connected to a storage node true; a first pull-down transistor connecting the storage node true to a ground rail; and a first pass-gate transistor connecting the bitline true to the storage node true, wherein the first pull-up transistor and the first pull-down transistor form a first inverter; and
   a second pull-up transistor with a second source connected to the positive voltage rail and a second drain connected to a storage node complement; a second pull-down transistor connecting the storage node complement to the ground rail; and a second pass-gate transistor connecting the bitline complement to the storage node complement, wherein the second pull-up transistor and the second pull-down transistor form a second inverter, wherein the first inverter and the second inverter are cross-coupled and wherein gates of the first pass-gate transistor and the second pass-gate transistor are controlled by the wordline.

7. The integrated circuit chip of claim 1, further comprising:
two-input multiplexors operably connected to adjacent pairs of columns in the memory array;
a first positive voltage boost circuit operably connected to even columns in the memory array; and
a second positive voltage boost circuit operably connected to odd columns in the memory array.

8. The integrated circuit chip of claim 1, further comprising:
four-input multiplexors operably connected to sets of four adjacent columns in the memory array;
a first positive voltage boost circuit operably connected to every first column in each set;
a second positive voltage boost circuit operably connected to every second column in each set;
a third positive voltage boost circuit operably connected to every third column in each set; and
a fourth positive voltage boost circuit operably connected to every fourth column in each set.

9. A method comprising:
providing an integrated circuit chip comprising a memory array and at least one positive voltage boost circuit operably connected to the memory array; and
performing a write operation to write a data value to a specific memory cell in a specific column and a specific row of the memory array, wherein the performing of the write operation comprises:
maintaining a bitline true of the specific column at a first positive voltage level,
discharging a bitline complement of the specific column to ground;
charging a wordline of the specific row to the first positive voltage level; and
subsequently, substantially concurrently discharging the wordline to ground and applying a positive voltage boost pulse to a positive voltage rail electrically connected to sources of pull-up transistors in the specific memory cell, wherein the positive voltage boost pulse increases a positive cell supply voltage from the first positive voltage level to a second positive voltage level that is higher than the first positive voltage level and ensures that writing of the data value to completed.

10. The method of claim 9, wherein the positive voltage boost pulse increases the positive cell supply voltage by 25 mV-200 mV.

11. The method of claim 9, wherein the positive voltage boost pulse comprises 0.2-0.5 ns pulse.

12. The method of claim 9, wherein the first positive voltage level is less than 0.75V.

13. The method of claim 9, wherein the performing of the write operation further comprises, following completion of the positive voltage boost pulse and the writing of the data value, recharging the bitline complement to the first positive voltage level.

14. The method of claim 13, wherein the write operation is performed using multiple different clock signals.

15. The method of claim 9, wherein the specific memory cell comprises a six-transistor static random access memory cell comprising:
a first pull-up transistor with a first source connected to the positive voltage rail and a first drain connected to a storage node true; a first pull-down transistor connecting the storage node true to a ground rail; and a first pass-gate transistor connecting the bitline true to the storage node true, wherein the first pull-up transistor and the first pull-down transistor form a first inverter; and
a second pull-up transistor with a second source connected to the positive voltage rail and a second drain connected to a storage node complement; a second pull-down transistor connecting the storage node complement to the ground rail; and a second pass-gate transistor connecting the bitline complement to the storage node complement, wherein the second pull-up transistor and the second pull-down transistor form a second inverter, wherein the first inverter and the second inverter are cross-coupled and wherein gates of the first pass-gate transistor and the second pass-gate transistor are controlled by the wordline.

16. A method comprising:
manufacturing integrated circuit chips, each integrated circuit chip comprising a substrate and a memory array on the substrate;
testing the integrated circuit chips;
sorting the integrated circuit chips into groups, based on results of the testing, wherein the groups comprise a fast n-type field effect transistor (NFET)-slow p-type field effect transistor (PFET) process corner group; and
attaching at least one positive voltage boost circuit to at least one selected integrated circuit chip from the fast NFET-slow PFET process corner group and operably connecting the positive voltage boost circuit to the memory array on the selected integrated circuit chip so as to enable application of positive voltage boost pulses to memory cells in the memory array substantially concurrently with wordline deactivation during write operations to store data values in the memory cells.

17. The method of claim 16, further comprising: sorting the integrated circuit chips within the fast NFET-slow PFET process corner group into sub-groups based on product-specific cell supply voltage specifications, wherein the sub-groups comprise at least a first sub-group with a first maximum cell supply voltage and a second sub-group with a second maximum cell supply voltage that is higher than the first maximum cell supply voltage, wherein positive voltage boost circuits are attached to all of the integrated circuit chips in the first sub-group.

18. The method of claim 17, wherein the first maximum cell supply voltage is less than 0.75V.

19. The method of claim 16, wherein a positive voltage boost pulse increases a positive cell supply voltage by 25 mV-200 mV.

20. The method of claim 16, wherein the positive voltage boost pulses comprise 0.2-0.5 ns pulses.

* * * * *